(12) United States Patent
Hirano

(10) Patent No.: US 6,337,230 B2
(45) Date of Patent: Jan. 8, 2002

(54) SEMICONDUCTOR DEVICE AND MANUFACTURING METHOD THEREOF

(75) Inventor: Yuuichi Hirano, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/838,267

(22) Filed: Apr. 20, 2001

Related U.S. Application Data

(62) Division of application No. 09/488,713, filed on Jan. 21, 2000, now Pat. No. 6,252,280.

(30) Foreign Application Priority Data

Sep. 3, 1999 (JP) .............................................. 11-250475

(51) Int. Cl.[7] .............................................. H01L 21/00
(52) U.S. Cl. ...................... 438/149; 438/151; 438/155; 438/174
(58) Field of Search .................... 438/149, 150, 438/152, 289, 200, 174, 194, 151, 155

(56) References Cited

U.S. PATENT DOCUMENTS

| 5,559,368 A | * | 9/1996 | Hu et al. ..................... 257/369 |
| 5,753,955 A | * | 5/1998 | Fechner ........................ 257/347 |
| 5,780,899 A | * | 7/1998 | Hu et al. ..................... 257/335 |
| 6,080,612 A | * | 6/2000 | Hsu ............................ 438/202 |
| 6,159,807 A | * | 12/2000 | Bryant et al. ................ 438/289 |
| 6,175,135 B1 | * | 1/2001 | Liao ........................... 257/350 |

* cited by examiner

*Primary Examiner*—Kevin M. Picardat
(74) *Attorney, Agent, or Firm*—Oblon, Spivak, McClelland, Maier & Neustadt, P.C.

(57) ABSTRACT

A semiconductor device can reduce parasitic capacitance between the pad portion of the gate electrode and the body region of a DTMOS on an SOI substrate. In an element forming region of an SOI substrate (1), an electrode portion (6NA) of a gate electrode (6N) is formed on the upper surface of an SOI layer (4) with a gate oxide film (5N) in between. In an element isolation region of the SOI substrate (1), a pad portion (6NB) of the gate electrode (6N) is formed on an element isolation insulation film (9), and a contact hole (11N) is selectively formed in the upper surface of an interlayer insulation film (10), extending through the element isolation insulation film (9) to the upper surface of the SOI layer (4). A sidewall of the pad portion (6NB) of the gate electrode (6N) is in contact with a W plug (21) which fills the contact hole (11N).

6 Claims, 25 Drawing Sheets

SEMICONDUCTOR DEVICE AND MANUFACTURING METHOD THEREOF

This application is a Division of application Ser. No. 09/488,713 filed on Jan. 21, 2000, now U.S. Pat. No. 6,252,280.

BACKGROUND OF THE INVENTION

1. Field of the Invention

The present invention relates to the structure of a semiconductor device and a manufacturing method thereof, and more especially relates to the structure of a Dynamic-Threshold Voltage MOSFET (DTMOSFET) built on a Silicon-On-Insulator (SOI) substrate and a manufacturing method thereof.

2. Description of the Background Art

Among MOSFETs on SOI, DTMOSFETs (hereinafter referred to as "DTMOSs") have been proposed as means for increasing operating speed. FIG. 42 is a cross-sectional view schematically showing the structure of a conventional DTMOS on SOI (cf. Assaderaghi et al., "A Dynamic Threshold Voltage MOSFET (DTMOS) for Ultra-Low Voltage Operation", IEDM 94–811, FIG. 1a). An SOI substrate 101 has a multilayer structure with a silicon substrate 102, a buried oxide film 103, and an SOI layer 104 stacked in this order. On the upper surface of the SOI layer 104, a multilayer gate structure is selectively formed, wherein a gate oxide film 105 and a gate electrode 106 are stacked in this order. In the upper surface of the SOI layer 104, a pair of source/drain regions 108 are formed to sandwich a body region 107 located under the gate structure. The gate electrode 106 and the body region 107 are electrically connected to each other.

FIG. 43 is a graph showing the relationships between body potential $V_B$ and operating threshold voltage $V_{TH}$ of a DTMOS transistor taken as an NMOS. When the transistor is turned on with a HIGH on the gate, the body potential $V_B$ correspondingly goes HIGH. This lowers the operating threshold voltage $V_{TH}$ as shown in FIG. 43, resulting in a larger current flow than a standard MOSFET on SOI.

FIG. 44 is a top view specifically showing the structure of the DTMOS in FIG. 42, and FIG. 45 is a cross-sectional view of the DTMOS in FIG. 44 taken along the line X1 (cf. Assaderaghi et al., "A Dynamic Threshold Voltage MOSFET (DTMOS) for Ultra-Low Voltage Operation", IEDM94–811, FIG. 1b). The gate electrode 106 includes an electrode portion 106A above the body region 107 sandwitched between the pair of source/drain regions 108, and a wider pad portion 106B connected to the electrode portion 106A. An element isolation insulation film 109 is formed by LOCOS to surround the source/drain regions 108 and the pad portion 106B. The bottom surface of the element isolation insulation film 109 reaches the upper surface of the buried oxide film 103. That is, the element isolation insulation film 109 achieves so-called "complete isolation". In the middle of the pad portion 106B, a conductor-filled contact hole 110 is formed, extending through the gate oxide film 105 to the upper surface of the SOI layer 104. A conductor 112 filling the contact hole 110, such as Al, provides electrical connections between the gate electrode 106 and a p$^+$-type region 111 which is selectively formed in the body region 107.

In such a conventional DTMOS, however, there is only a small distance between the pad portion 106B and the SOI layer 104 (body region 107). This causes high parasitic capacitance therebetween, which is added to gate capacitance, thereby increasing delay in operation.

SUMMARY OF THE INVENTION

A first aspect of the present invention is directed to a semiconductor device comprising: an SOI substrate having a multilayer structure with a semiconductor substrate, an insulating layer, and a semiconductor layer stacked in this order; a first element isolation insulation film formed in an upper surface of the semiconductor layer to a predetermined depth that does not reach an upper surface of the insulating layer, in an element isolation region of the SOI substrate; a gate insulation film formed on the upper surface of the semiconductor layer in an element forming region of the SOI substrate; a gate electrode formed on the gate insulation film and the first element isolation insulation film; an interlayer insulation film formed on the gate electrode and the first element isolation insulation film; and a contact hole filled with a conductor, which is selectively formed in an upper surface of the interlayer insulation film, extending through the interlayer insulation film and the first element isolation insulation film to the upper surface of the semiconductor layer in the element isolation region of the SOI substrate, the conductor being in contact with the gate electrode on the first element isolation insulation film.

According to a second aspect of the present invention, in the semiconductor device of the first aspect, the gate electrode is formed so that its sidewall is on the first element isolation insulation film; and the conductor is in contact with the sidewall of the gate electrode.

According to a third aspect of the present invention, the semiconductor device of the first aspect further comprises: an impurity region formed in the part of the upper surface of the semiconductor layer that is in contact with the contact hole, the impurity region having a higher impurity concentration than the semiconductor layer.

According to a fourth aspect of the present invention, the semiconductor device of the first aspect includes a plurality of semiconductor devices and further comprises: a second element isolation insulation film extending from the upper surface of the semiconductor layer to the upper surface of the insulating layer, between adjacent ones of the semiconductor devices.

A fifth aspect of the present invention is directed to a method of manufacturing a semiconductor device, comprising the steps of: (a) preparing an SOI substrate having a multilayer structure with a semiconductor substrate, an insulating layer, and a semiconductor layer stacked in this order; (b) forming a first element isolation insulation film in an upper surface of the semiconductor layer to a predetermined depth that does not reach an upper surface of the insulating layer, in an element isolation region of the SOI substrate; (c) forming a gate insulation film on the upper surface of the semiconductor layer in an element forming region of the SOI substrate; (d) forming a gate electrode on the gate insulation film and the first element isolation insulation film; (e) forming an interlayer insulation film on the gate electrode and the first element isolation insulation film; (f) selectively forming a contact hole in an upper surface of the interlayer insulation film, extending through the first element isolation insulation film to the upper surface of the semiconductor layer, in the element isolation region of the SOI substrate, the contact hole being in contact with the gate electrode on the first element isolation insulation film; and (g) filling the contact hole with a conductor.

According to a sixth aspect of the present invention, the method of the fifth aspect further comprises the step of: (h) between the steps (f) and (g), forming an impurity region with a higher impurity concentration than the semiconductor layer, by introducing impurities into the upper surface of the semiconductor layer through the contact hole.

According to a seventh aspect of the present invention, the method of the fifth aspect further comprises the step of: (i) before the step (f), forming an insulation film between a bottom surface of the first element isolation insulation film and the upper surface of the semiconductor layer, the insulation film being made with a material different from the first element isolation insulation film. The step (f) includes the steps of: (f-1) selectively removing the interlayer insulation film and the first element isolation insulation film, using the insulation film as an etching stopper; and (f-2) removing the insulation film exposed in the step (f-1).

According to an eighth aspect of the present invention, in the method of the fifth aspect, the step (b) includes the steps of: (b-1) forming a recessed portion by removing the upper surface of the semiconductor layer in the element isolation region by anisotropic etching having a high etch rate in a depth direction of the SOI substrate; and (b-2) forming the first element isolation insulation film to fill the recessed portion.

According to a ninth aspect of the present invention, in the method of the fifth aspect, the semiconductor includes a plurality of semiconductor devices. The method further comprises the step of: (j) forming a second element isolation insulation film extending from the upper surface of the semiconductor layer to the upper surface of the insulating layer, between adjacent ones of the semiconductor devices, wherein the step (b) and (j) are performed by the steps of: (x-1) forming a first recessed portion by removing the upper surface of the semiconductor layer in the element isolation region to a depth that does not reach the upper surface of the insulating layer; (x-2) forming a second recessed portion reaching the upper surface of the insulating layer, by selectively removing a bottom surface of the first recessed portion; and (x-3) filling the first and second recessed portions with insulation films.

In the semiconductor device of the first aspect, an increased distance between the gate electrode and the semiconductor layer by the presence of the first element isolation insulation film therebetween reduces parasitic capacitance therebetween, thus suppressing delay in operation.

The semiconductor device of the second aspect can reduce the area of the gate electrode for the contact hole, as compared to the device wherein the contact hole for establishing electrical connections between the gate electrode and the semiconductor layer is formed in the middle of the gate electrode.

The semiconductor device of the third aspect can reduce contact resistance between the semiconductor layer and the conductor which fills the contact hole.

In the semiconductor device of the fourth aspect, the second element isolation insulation film achieves complete electrical isolation between adjacent semiconductor devices. This makes it possible to appropriately prevent the occurrence of leakage current and latch-up in the operation of the semiconductor device.

In the method of the fifth aspect, an increased distance between the semiconductor layer and the gate electrode by the presence of the first element isolation insulation film therebetween reduces parasitic capacitance therebetween, thus suppressing delay in operation.

In the method of the sixth aspect, it is possible to reduce contact resistance between the semiconductor layer and the conductor which fills the contact hole.

In the method of the seventh aspect, the contact hole does not reach the insulating layer through the semiconductor layer even if the semiconductor layer between the bottom surface of the first element isolation insulation film and the upper surface of the semiconductor layer has a small film thickness. This ensures electrical connections between the gate electrode and the semiconductor layer.

In the method of the eighth aspect, the occurrence of bird's beak can be minimized as compared to the method wherein the first element isolation insulation film is formed by LOCOS. This allows reduction in device dimension.

In the method of the ninth aspect, the second element isolation insulation film achieves complete electrical isolation between adjacent semiconductor devices. This makes it possible to appropriately prevent the occurrence of leakage current and latch-up in the operation of the semiconductor device.

An object of the present invention is to provide a semiconductor device capable of suppressing delay in operation by reducing parasitic capacitance between the pad portion of the gate electrode and the body region of DTMOS on the SOI substrate, and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
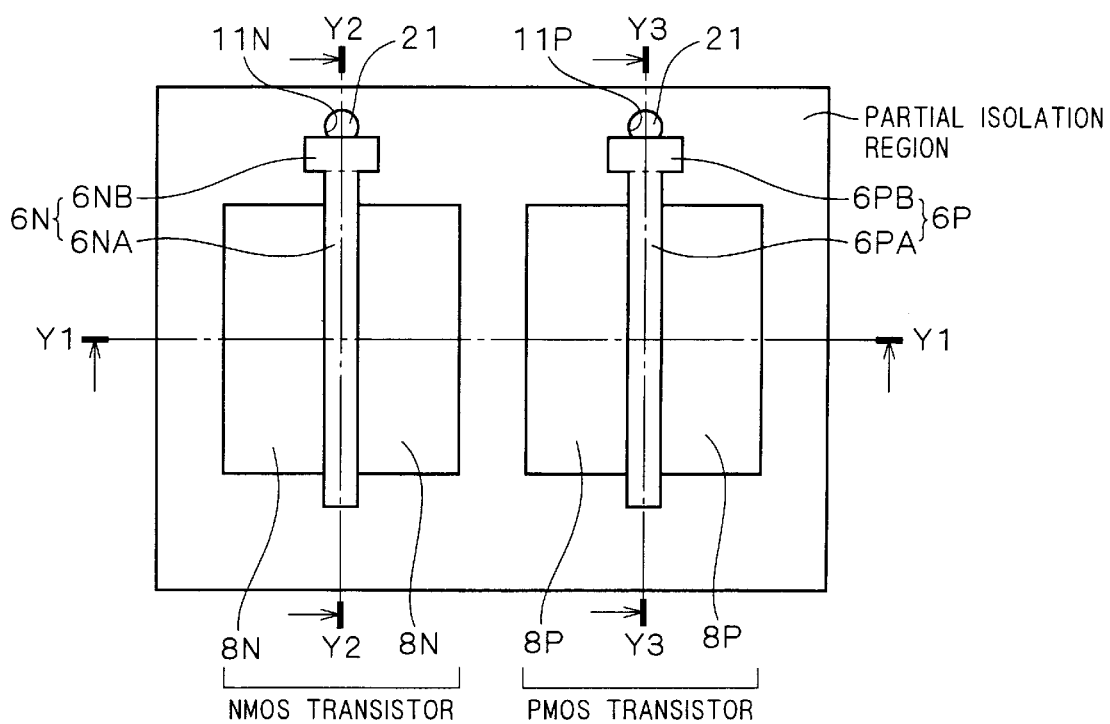
FIG. 1 is a top view showing the structure of a DTMOS according to a first preferred embodiment of the present invention.
Figure 2:
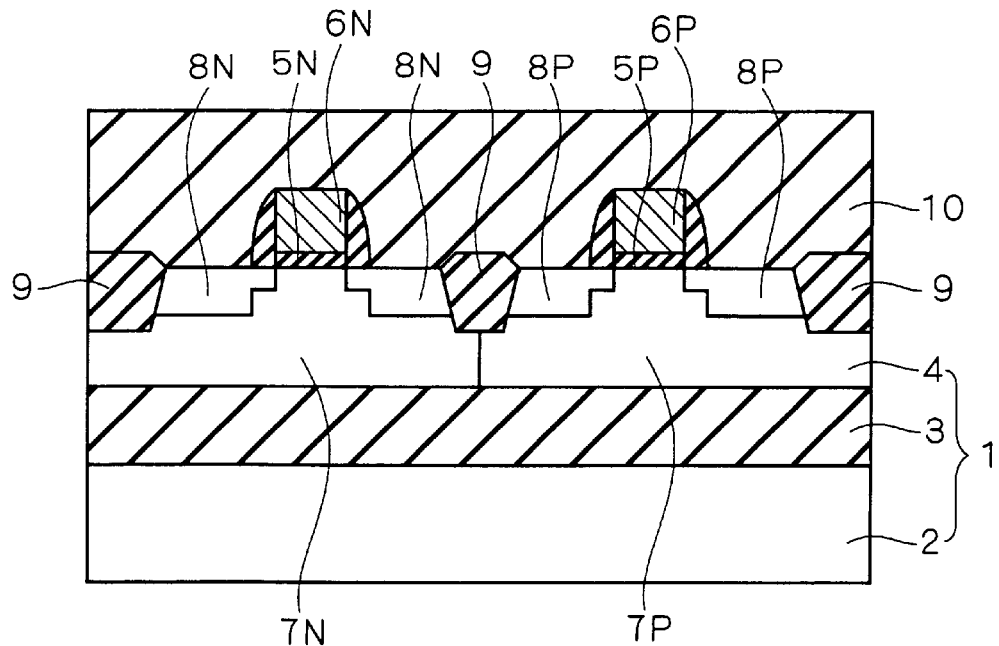
FIGS. 2 to 5 are cross-sectional views showing the structure of the DTMOS of the first preferred embodiment.
Figure 3:
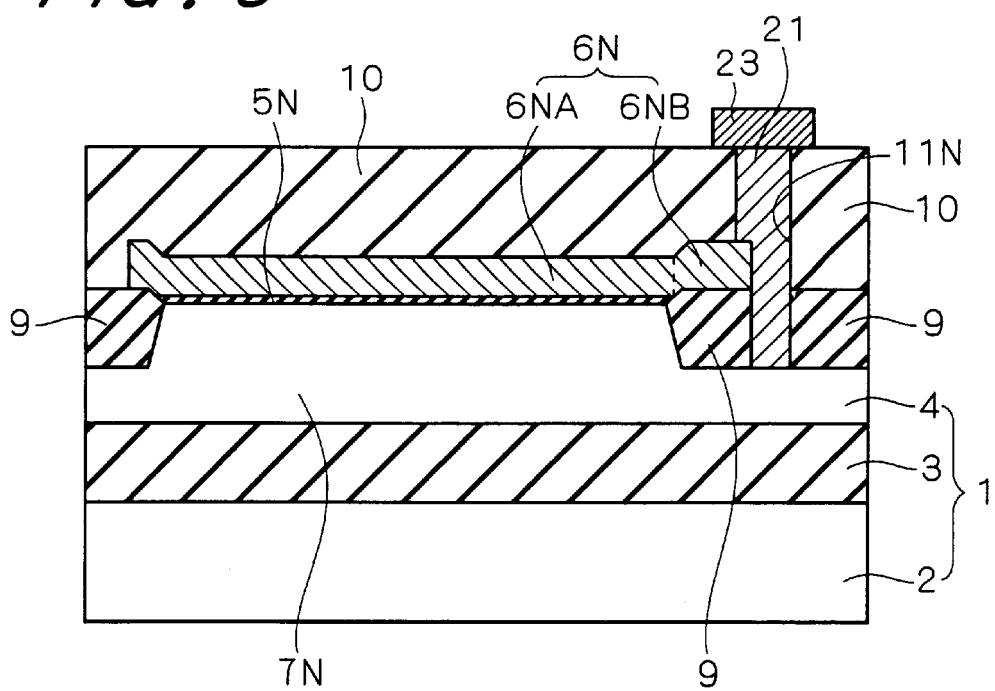
Figure 4:
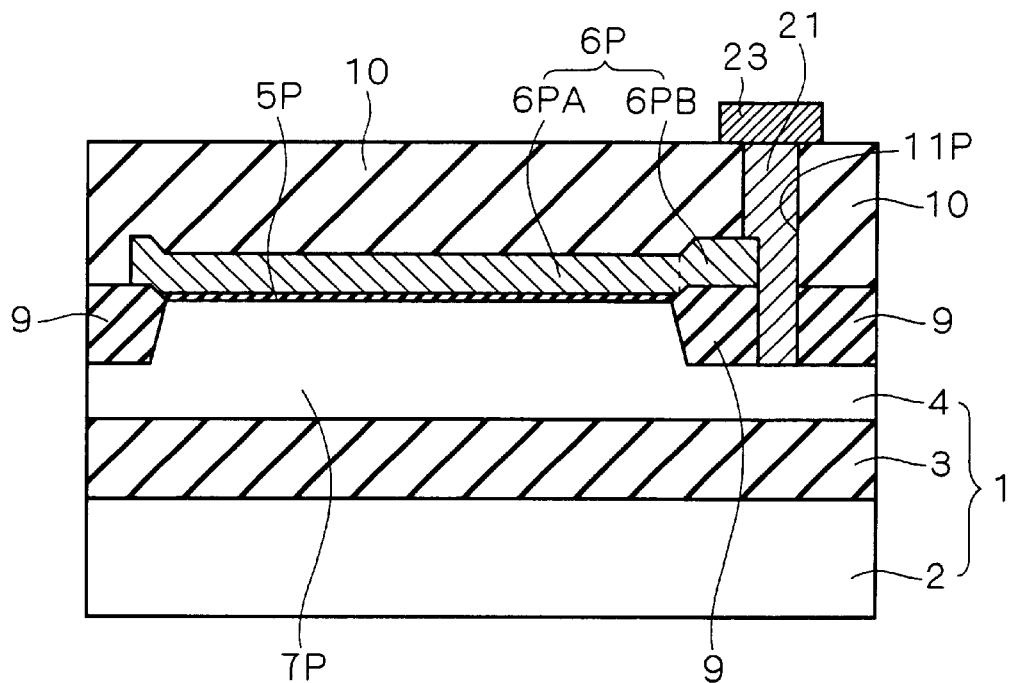

FIG. 1 is a top view showing the structure of a DTMOS according to a first preferred embodiment of the present invention. However, an interlayer insulation film 10 and an Al interconnection layer 23 described later are not shown. In FIG. 1, two transistors, NMOS and PMOS, are formed adjacent to each other. FIGS. 2 to 4 are cross-sectional views of the DTMOS in FIG. 1 taken along the lines Y1, Y2, Y3, respectively.

Referring now to FIG. 2, an SOI substrate 1 has a multilayer structure with a silicon substrate 2, a buried oxide film 3, and an SOI layer 4 stacked in this order. In an element forming region of the SOI substrate 1, multilayer gate structures are selectively formed on the upper surface of the SOI layer 4, each having a gate oxide film 5N, 5P and a gate electrode 6N, 6P stacked in this order. Further, pairs of source/drain regions 8N, 8P are formed in the upper surface of the SOI layer 4 to sandwich body regions 7N, 7P located under the gate structures, respectively. In an element isolation region of the SOI substrate 1, an element isolation insulation film 9 is formed in the upper surface of the SOI layer 4. The bottom surface of the element isolation insulation film 9 does not reach the upper surface of the buried oxide film 3; therefore, so-called "partial isolation" is achieved (cf. Koh et al., "BC (Body-Contacted) SOI-CMOS Technology and Its Application to High Density Memory", Extended Abstracts of the 1998 International Conference on Solid State Devices and Materials, Hiroshima, 1998, pp. 306–307, FIG. 1). The interlayer insulation film 10 is formed over the entire surface.

Referring to FIG. 1, each of the gate electrodes 6N, 6P has an electrode portion 6NA, 6PA above the body region 7N, 7P sandwiched between the pair of source/drain regions 8N, 8P, and a wider pad portion 6NB, 6PB connected to the electrode portion 6NA, 6PA. A partial isolation region where the element isolation insulation film 9 is formed is provided to surround the source/drain regions 8N, 8P. In the pad portions 6NB, 6PB of the gate electrodes 6N, 6P, contact holes 11N, 11P filled with W plugs 21 are formed, respectively.

Referring to FIG. 3, in the element forming region of the SOI substrate 1, the electrode portion 6NA of the gate electrode 6N is formed on the upper surface of the SOI layer 4 with the gate oxide film 5N therebetween. The pad portion 6NB of the gate electrode 6N is formed on the element isolation insulation film 9 in the element isolation region of the SOI substrate 1. In the element isolation region, further, the contact hole 11N is selectively formed in the upper surface of the interlayer insulation film 10, extending through the interlayer insulation film 10 and the element isolation insulation film 9 to the upper surface of the SOI layer 4. A sidewall of the pad portion 6NB is in contact with the W plug 21 which fills the contact hole 11N. On the part of the upper surface of the interlayer insulation film 10 where the contact hole 11N is formed, the Al interconnection layer 23 is formed in contact with the W plug 21.

Referring to FIG. 4, in the element forming region of the SOI substrate 1, the electrode portion 6PA of the gate electrode 6P is formed on the upper surface of the SOI layer 4 with the gate oxide film 5P therebetween. The pad portion 6PB of the gate electrode 6P is formed on the element isolation insulation film 9 in the element isolation region of the SOI substrate 1. In the element isolation region, further, the contact hole 11P is selectively formed in the upper surface of the interlayer insulation film 10, extending through the interlayer insulation film 10 and the element isolation insulation film 9 to the upper surface of the SOI layer 4. A sidewall of the pad portion 6PB is in contact with the W plug 21 filling the contact hole 11P. On the part of the upper surface of the interlayer insulation film 10 where the contact hole 11P is formed, the Al interconnection layer 23 is formed in contact with the W plug 21.

Figure 5:
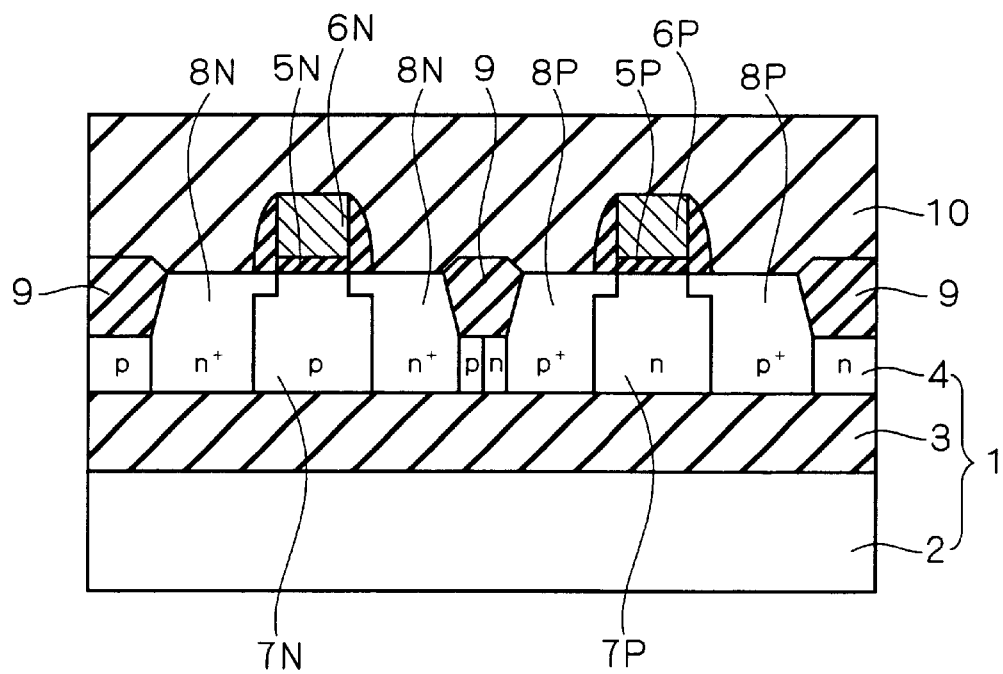

In contrast with FIG. 2, FIG. 5 is a cross-sectional view showing another structure of the DTMOS according to the first preferred embodiment of the present invention. In the structure of FIG. 2, the bottom surfaces of the respective source/drain regions 8N, 8P do not reach the upper surface of the buried oxide film 3. The source/drain regions 8N, 8P, however, may be provided deeply so that their bottom surfaces reach the upper surface of the buried oxide film 3 as in FIG. 5. Such a structure reduces junction capacitance, thus increasing operating speed. The same applies to second to fourth preferred embodiments described later.

Figure 6:
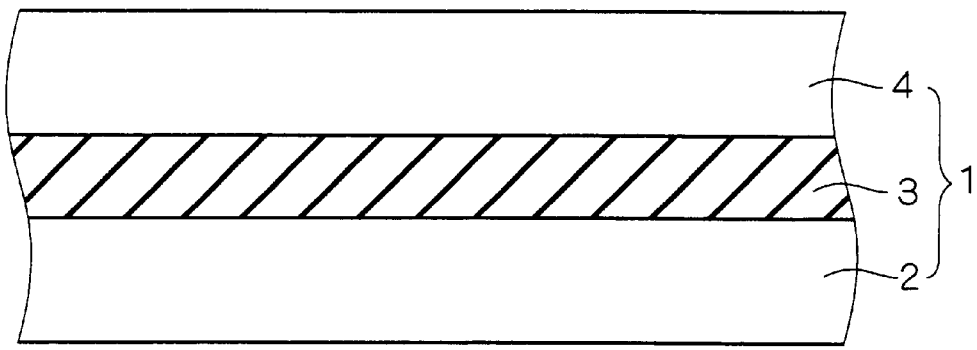
FIGS. 6 to 14 are cross-sectional views showing a method of manufacturing a DTMOS, step by step, according to the first preferred embodiment.

FIGS. 6 to 14 are cross-sectional views showing a method of manufacturing the DTMOS shown in FIGS. 1 to 4, step by step, taking an NMOS transistor as an example. First, the multilayer SOI substrate 1 is prepared, wherein the buried oxide film 3 which is a silicon oxide film with a thickness of about 4,000 Å and the SOI layer 4 with a thickness of several thousand angstroms (e.g., 2,000 Å) are stacked in this order on the silicon substrate 2 (FIG. 6).

Figure 7:
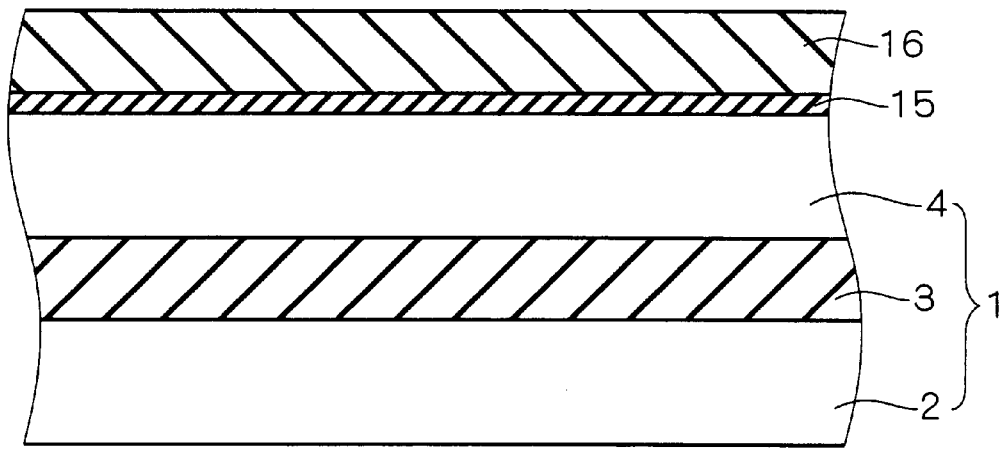

A silicon oxide film 15 with a thickness of several hundred angstroms (e.g., 500 Å) is formed on the upper surface of the SOI layer 4, and a silicon nitride film 16 with a thickness of several thousand angstroms (e.g., 1,000 Å) is formed on the silicon oxide film 15 (FIG. 7).

Figure 8:
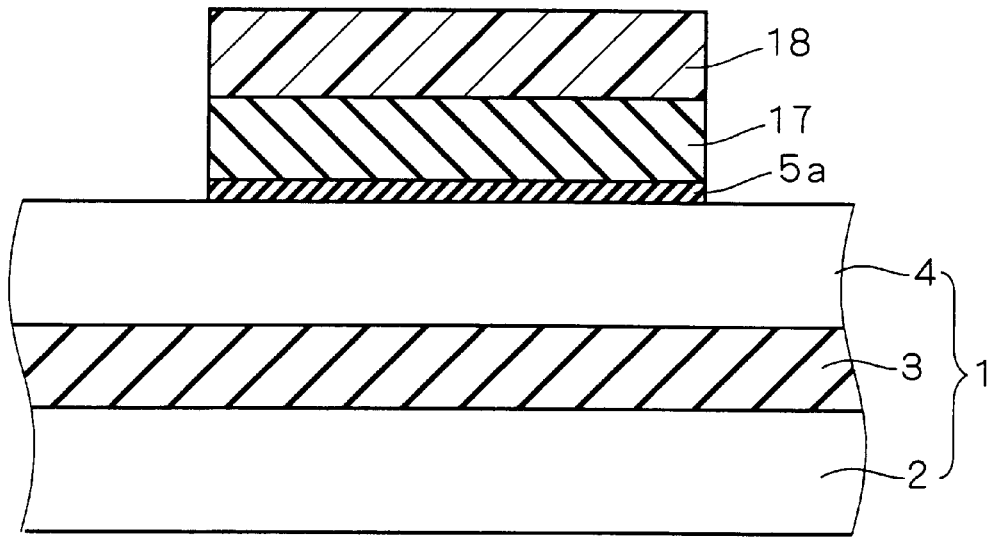

After a resist 18 is formed above the element forming region of the SOI substrate 1, the parts of the silicon nitride film 16 and the silicon oxide film 15 where the resist 18 is not formed are etched to expose the upper surface of the SOI layer 4 in the element isolation region of the SOI substrate 1. This process produces a multilayer structure with a silicon oxide film 5a, a silicon nitride film 17, and the resist 18 stacked in this order on the upper surface of the SOI layer 4 in the element forming region of the SOI substrate 1 (FIG. 8).

Figure 9:
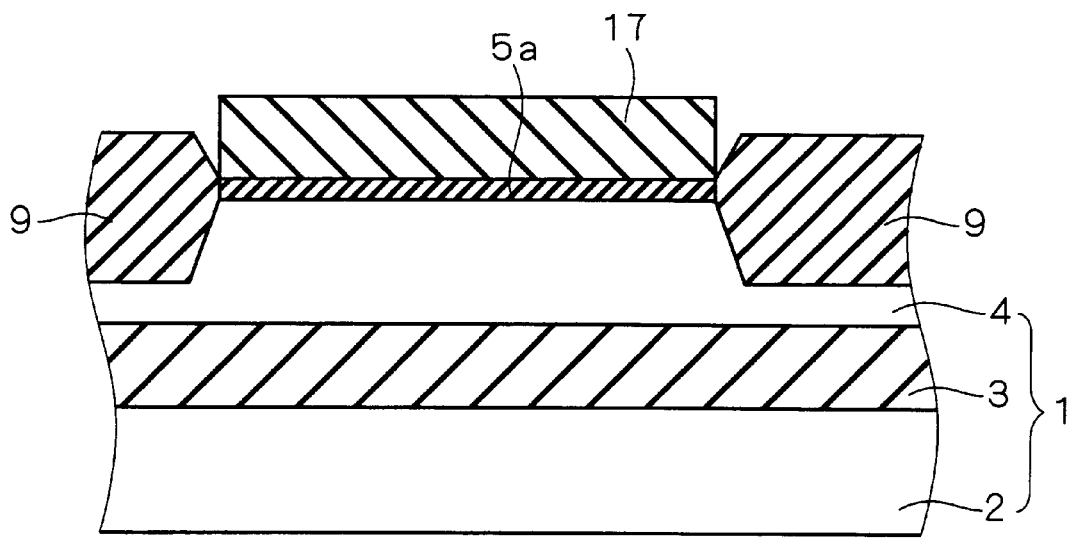

After removal of the resist 18, the exposed upper surface of the SOI layer 4 is thermally oxidized to the element isolation insulation film 9 which is a silicon oxide film with a thickness of about 1,000 Å (FIG. 9). As shown in FIG. 9, the bottom surface of the element isolation insulation film 9 does not reach the upper surface of the buried oxide film 3, and the SOI layer 4 exists in between.

Figure 10:
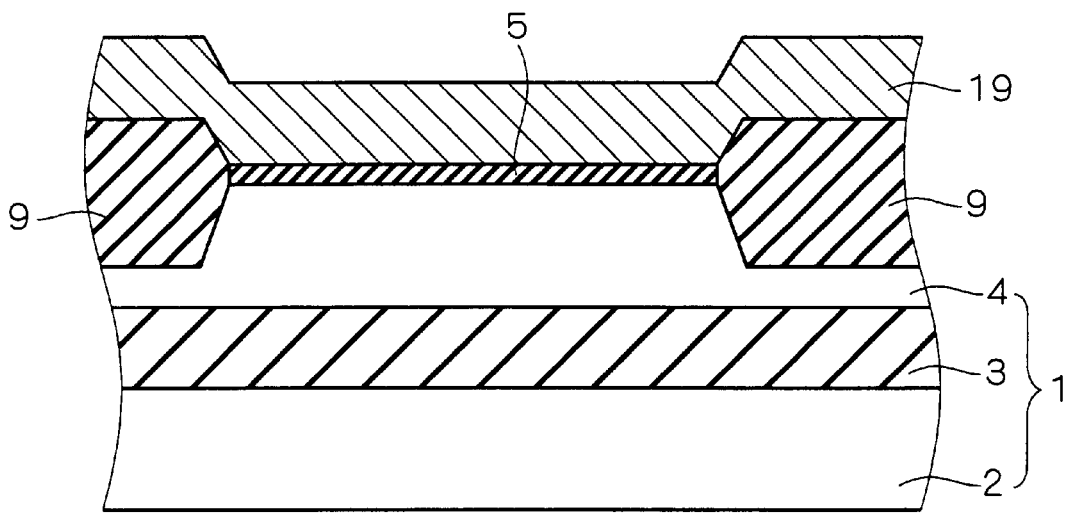

After removal of the silicon nitride film 17, ions are implanted in the upper surface of the SOI layer 4 to form a channel region. For NMOS transistors, boron (B) ions are implanted at 20 to 50 keV at a dose of $1 \times 10^{12}$ to $1 \times 10^{13}$ cm$^{-2}$. For PMOS transistors, arsenic (As) ions are implanted at 100 to 160 keV at a dose of $1 \times 10^{12}$ to $1 \times 10^{13}$ cm$^{-2}$. Following this, the silicon oxide film 5a is removed, and a gate oxide film 5 which is a silicon oxide film with a thickness of several tens of angstroms (e.g., 50 Å) is formed by thermal oxidation on the upper surface of the SOI layer 4 in the element forming region of the SOI substrate 1. Further, a polysilicon film 19 with a thickness of several thousand angstroms (e.g., 2,000 Å) is formed by CVD over the entire surface (FIG. 10).

Figure 11:
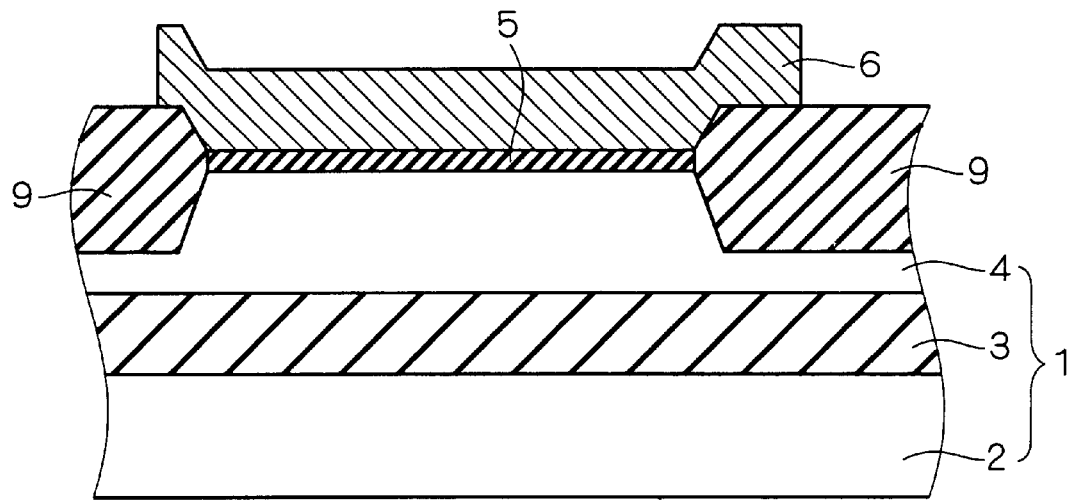

By patterning the polysilicon film 19, a gate electrode 6 is formed over the upper surface of the gate oxide film 5, with their side ends extending to the upper surface of the element isolation insulation film 9 (FIG. 11).

Figure 12:
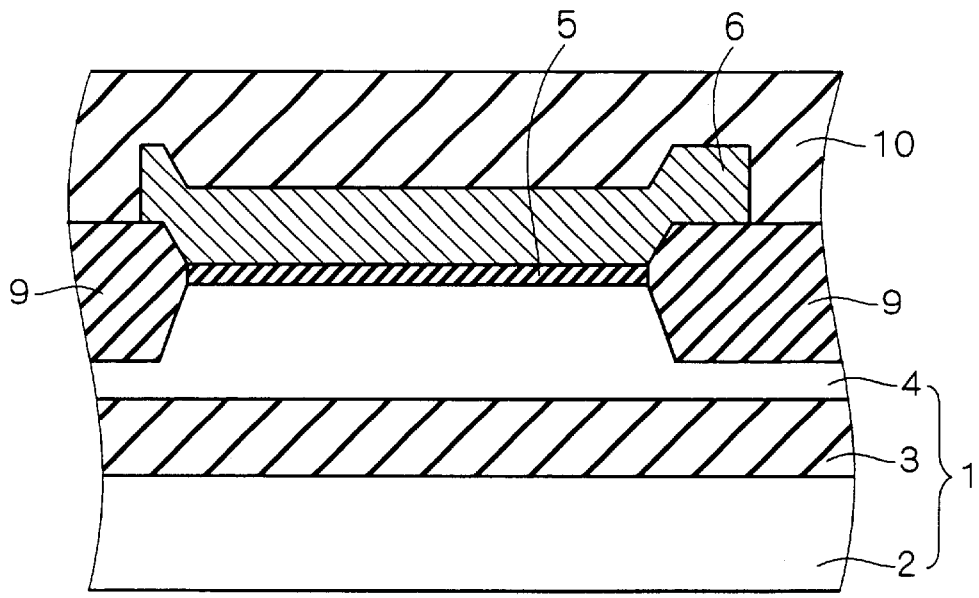

With the gate electrode 6 and the element isolation insulation film 9 as masks, As ions are implanted into the upper surface of the SOI layer 4, for example, at 10 to 50 keV at a dose of $1 \times 10^{15}$ to $5 \times 10^{15}$ cm$^{-2}$. For PMOS transistors, B or BF$_2$ ions are implanted at 10 to 50 keV at a dose of $1 \times 10^{15}$ to $5 \times 10^{15}$ cm$^{-2}$. This process produces source/drain regions 8 in the upper surface of the SOI layer 4. Further, the interlayer insulation film 10 which is a silicon oxide film with a thickness of about 10,000 Å, is formed by CVD (FIG. 12).

Figure 13:
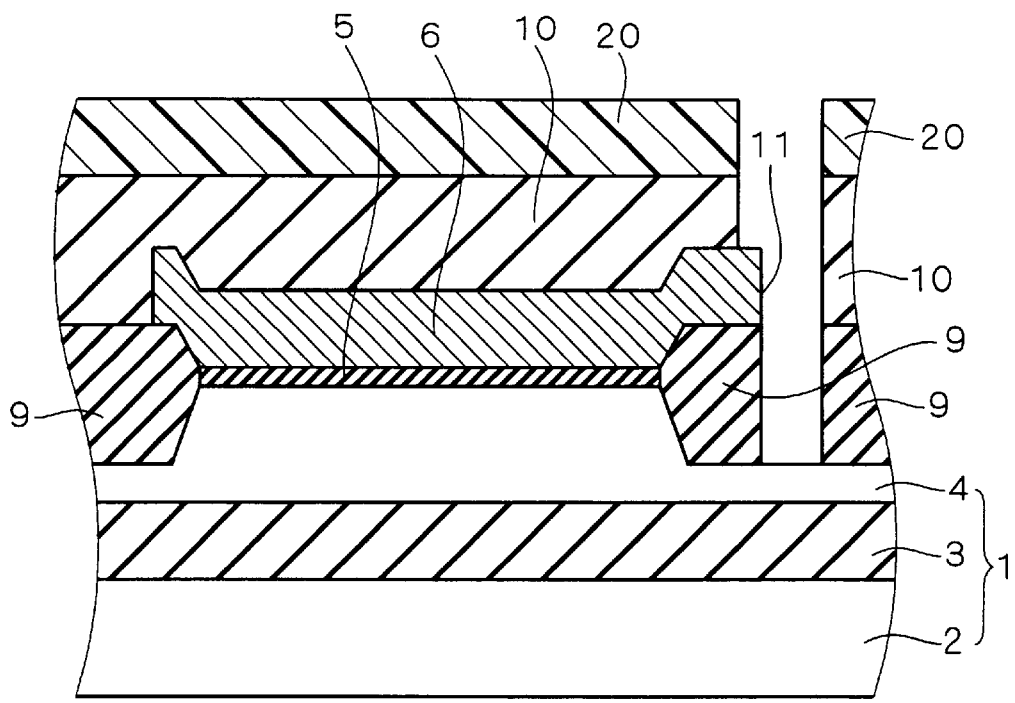

On the upper surface of the interlayer insulation film 10, a resist 20 is formed, which has an aperture pattern above the side end of the gate electrode 6. With the resist 20 as a mask, the interlayer insulation film 10 and the element isolation insulation film 9 are removed by anisotropic dry etching having a high etch rate in the depth direction of the SOI substrate 1. This produces a contact hole 11 and exposes the upper surface of the SOI layer 4. By etching the polysilicon film and the silicon oxide film with high selectivity, it is possible to expose the side end of the gate electrode 6 in the contact hole 11 (FIG. 13).

Figure 14:
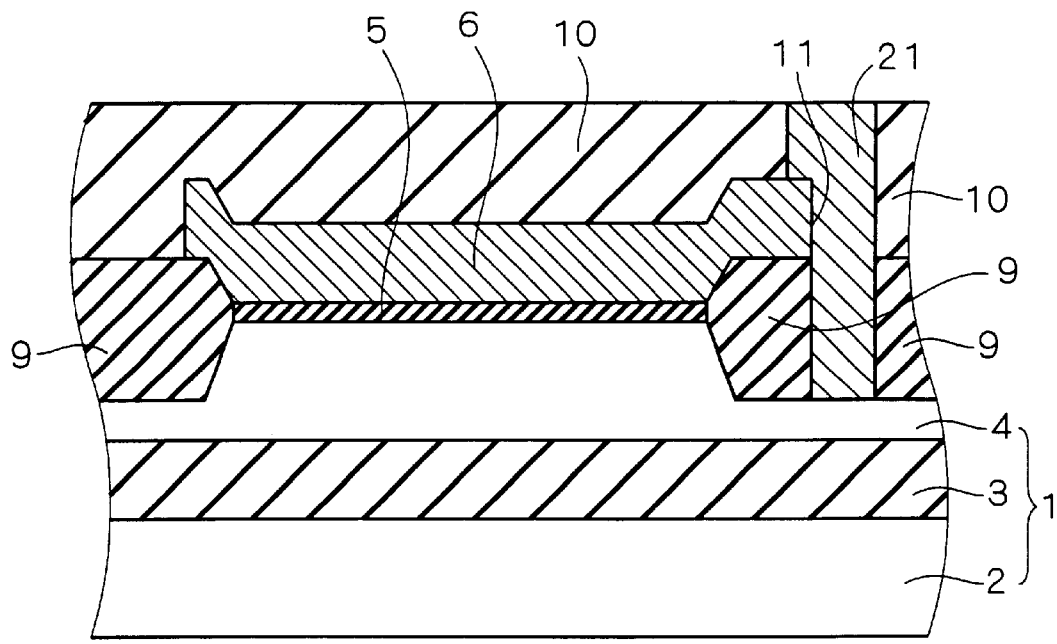

After removal of the resist 20, the contact hole 11 is filled with the W plug 21 FIG. 14). Then, the Al interconnection layer 23 is formed on the part of the upper surface of the interlayer insulation film 10 where the contact hole 11 is formed. This results in the structure shown in FIG. 3.

In the aforementioned semiconductor device and manufacturing method of the same according to the first preferred embodiment, a DTMOS using an SOI substrate adopts partial isolation as an element isolation insulation film, wherein the pad portion of the gate electrode extends over the element isolation insulation film. Also, the conductor which fills the contact hole in the element isolation insulation film provides electrical connections between the pad portion of the gate electrode and the SOI layer (body region). An increased distance between the pad portion of the gate electrode and the body region by the presence of the element isolation insulation film therebetween reduces parasitic capacitance therebetween, thus suppressing delay in operation.

Further, the formation of contact holes in the element isolation region of the SOI substrate reduces the area of the element forming region in the SOI substrate to about half that of a conventional semiconductor device. Besides, since the contact hole is formed not in the middle of the pad portion of the gate electrode but in contact with the side end of the pad portion of the gate electrode, the area of the pad portion of the gate electrode can also be reduced.

The adoption of partial isolation as an element isolation insulation film, unlike conventional complete isolation, simplifies a pattern layout. That is, while the complete isolation requires the optimization of the pattern layout, the partial isolation allows a direct use of the bulk layout for SOI.

Second Preferred Embodiment

Figure 15:
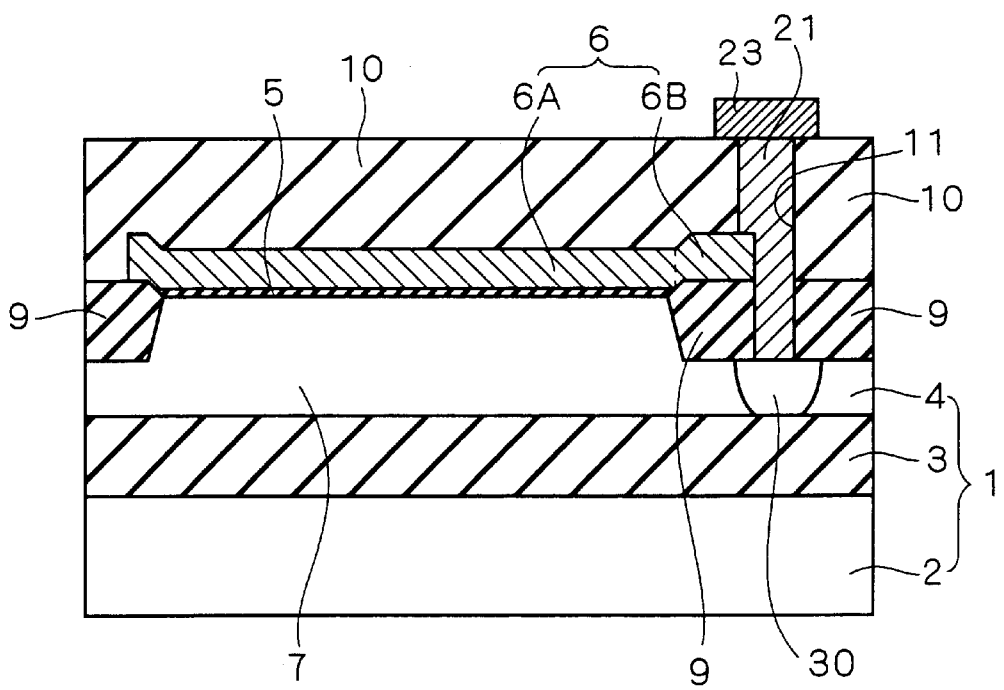
FIG. 15 is a cross-sectional view showing the structure of a DTMOS according to a second preferred embodiment of the present invention.

FIG. 15 is a cross-sectional view showing the structure of a DTMOS according to a second preferred embodiment of the present invention. The DTMOS of the second preferred embodiment, based on the DTMOS of the first preferred embodiment, further comprises a high-concentration impurity region 30 formed in the part of the upper surface of the SOI layer 4 that is in contact with the contact hole 11. The impurity region 30 has a higher impurity concentration than the other part of the SOI layer 4. When the impurity concentration of the SOI layer 4 in the element forming region of the SOI substrate 1 is $5 \times 10^{17}$ cm$^{-3}$, for example, that of the high-concentration impurity region 30 is $1 \times 10^{20}$ cm$^{-3}$.

Figure 16:
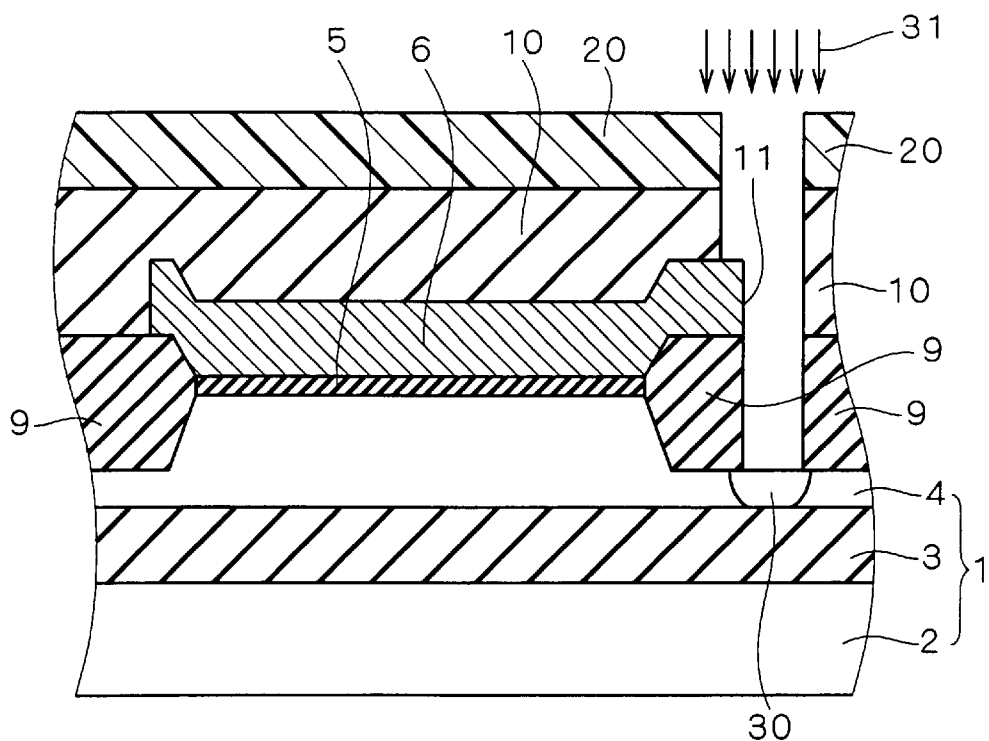
FIG. 16 is a cross-sectional view showing one step of a method of manufacturing a DTMOS according to the second preferred embodiment.

FIG. 16 is a cross-sectional view showing a step of the method of manufacturing the DTMOS in FIG. 15. First, the structure as in FIG. 13 is obtained through the same process as in the first preferred embodiment. Then, a p$^+$-type impurity region 30 is formed by introducing impurities 31 such as As (or n-type impurities such as B, BF$_2$ for the formation of an n$^+$-type impurity region 30), with the resist 20 as a mask, into the upper surface of the SOI layer 4 which is exposed by the opening of the contact hole 11. After removal of the resist 20, the contact hole 11 is filled with the W plug 21 and the Al interconnection layer 23 is formed in the part of the upper surface of the interlayer insulation film 10 where the contact hole 11 is formed. This results in the structure shown in FIG. 15.

In the semiconductor device and manufacturing method of the same according to the second preferred embodiment, a high-concentration impurity region is formed in the upper surface of the SOI layer which is exposed by the opening of the contact hole. This reduces contact resistance between the conductor which fills the contact hole and the body region.

Third Preferred Embodiment

Figure 17:
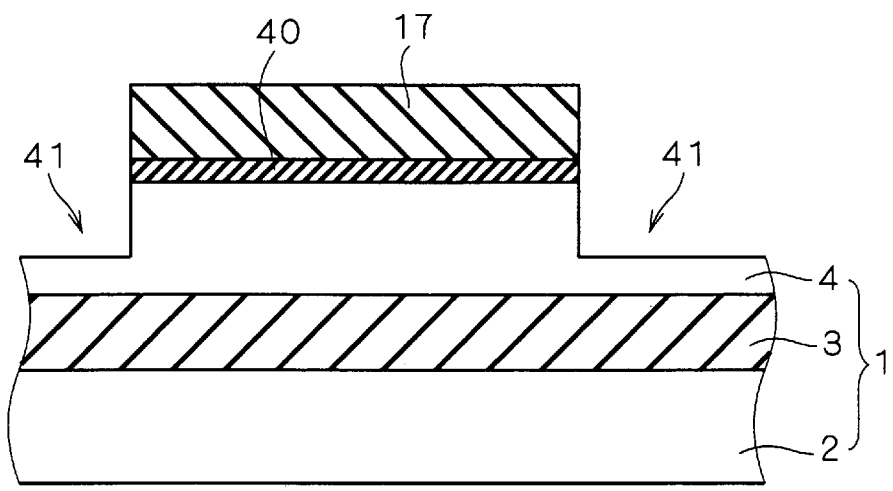
FIGS. 17 to 25 are cross-sectional views showing a method of manufacturing a DTMOS, step by step, according to a third preferred embodiment of the present invention.

FIGS. 17 to 25 are cross-sectional views showing a method of manufacturing a DTMOS according to a third preferred embodiment of the present invention, step by step. First, the structure as in FIG. 8 is obtained through the same process as in the first preferred embodiment. After removal of the resist 18, with the silicon nitride film 17 as a mask, the exposed upper surface of the SOI layer 4 is removed about 1,000 Å by anisotropic dry etching having a high etch rate in the depth direction of the SOI substrate 1. This produces recessed portions 41 in the upper surface of the SOI layer 4 in the element isolation region (FIG. 17).

Figure 18:
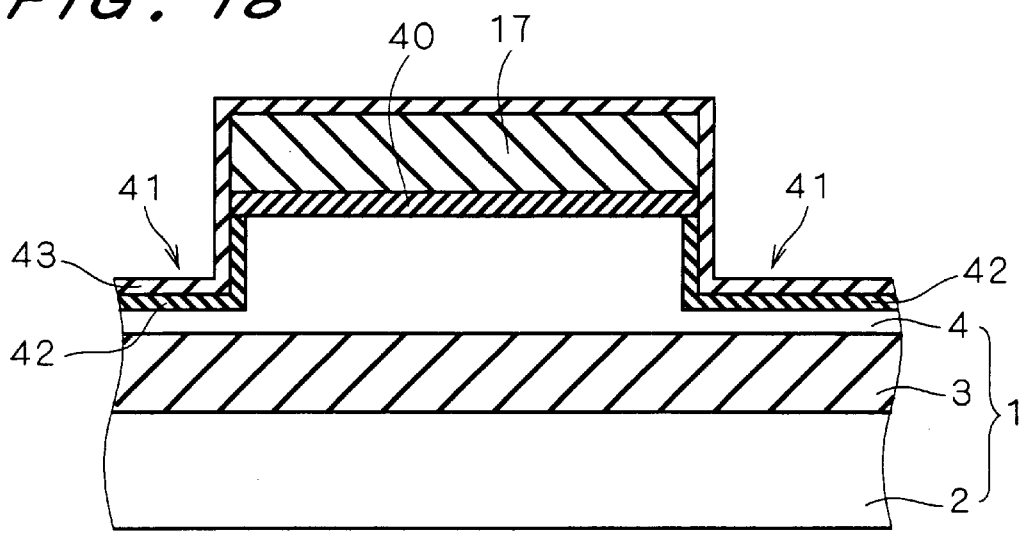

A resultant exposed surfaces of the SOI layer 4 after the formation of the recessed portions 41 are then thermally oxidized to form a silicon oxide film 42 with a thickness of several hundred angstroms. Further, a silicon nitride film 43 with a thickness of several hundred angstroms is formed over the entire surface by CVD (FIG. 18).

Figure 19:
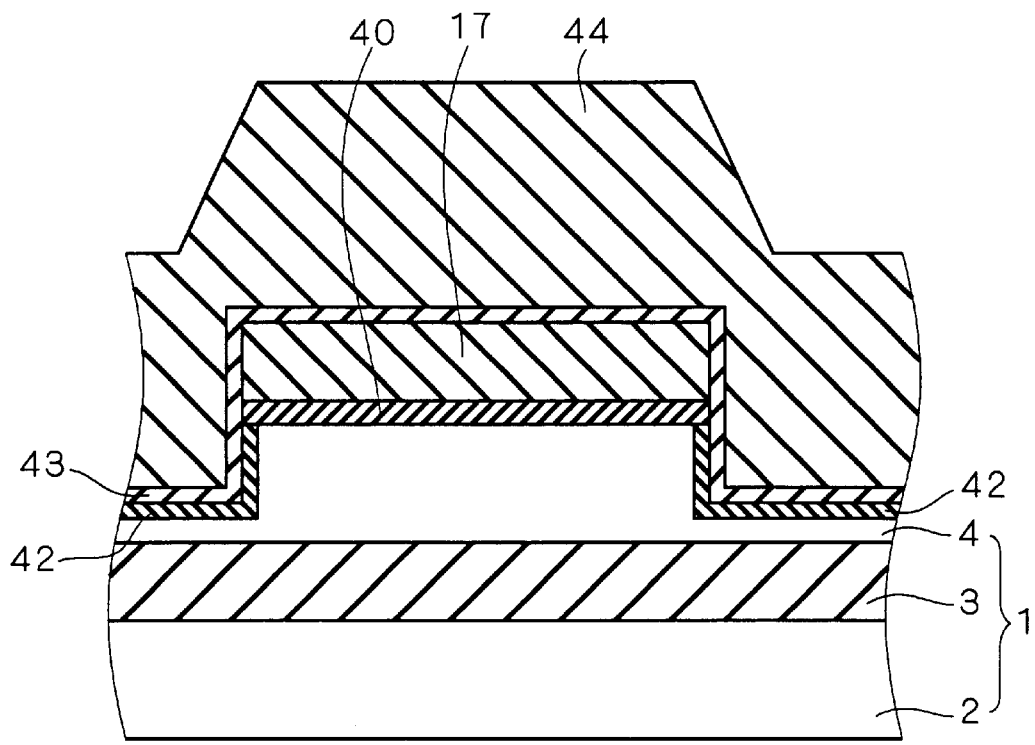
Figure 20:
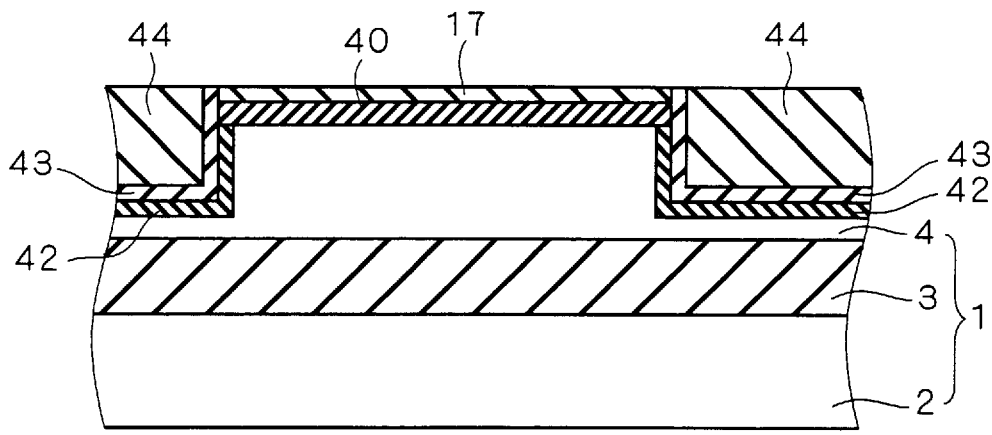

Then, a silicon oxide film 44 with a thickness of about 5,000 Å is formed across the surface by CVD (FIG. 19). Leaving part of the bottom of the silicon nitride film 17, the silicon oxide film 44 and the silicon nitride films 43, 17 are polished by CMP to planarize the surface (FIG. 20). The silicon oxide film 44 left after the CMP process serves as an element isolation insulation film (so-called "partial trench isolation").

Figure 21:
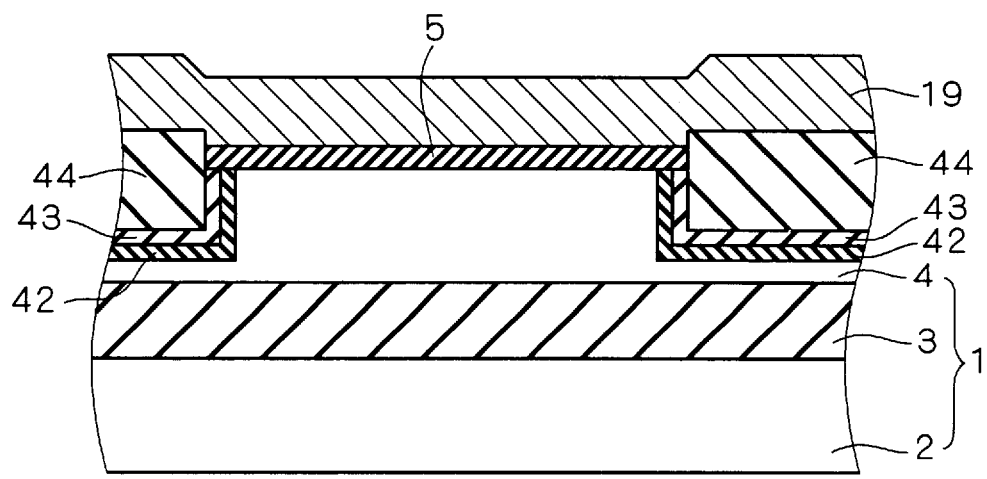

After the remaining silicon nitride film 17 is removed by wet etching, ions are implanted into the upper surface of the SOI layer 4 to form a channel region. For NMOS transistors, B ions are implanted at 20 to 50 keV at a dose of $1 \times 10^{12}$ to $1 \times 10^{13}$ cm$^{-2}$. For PMOS transistors, As ions are implanted at 100 to 160 keV at a dose of $1 \times 10^{12}$ to $1 \times 10^{13}$ cm$^{-2}$. The silicon oxide film 40 is then removed by wet etching, and the gate oxide film 5 with a thickness of several tens of angstroms is formed by thermal oxidation on the exposed upper surface of the SOI layer 4. After that, the polysilicon film 19 with a thickness of several thousand angstroms is formed over the entire surface by CVD (FIG. 21).

Figure 22:
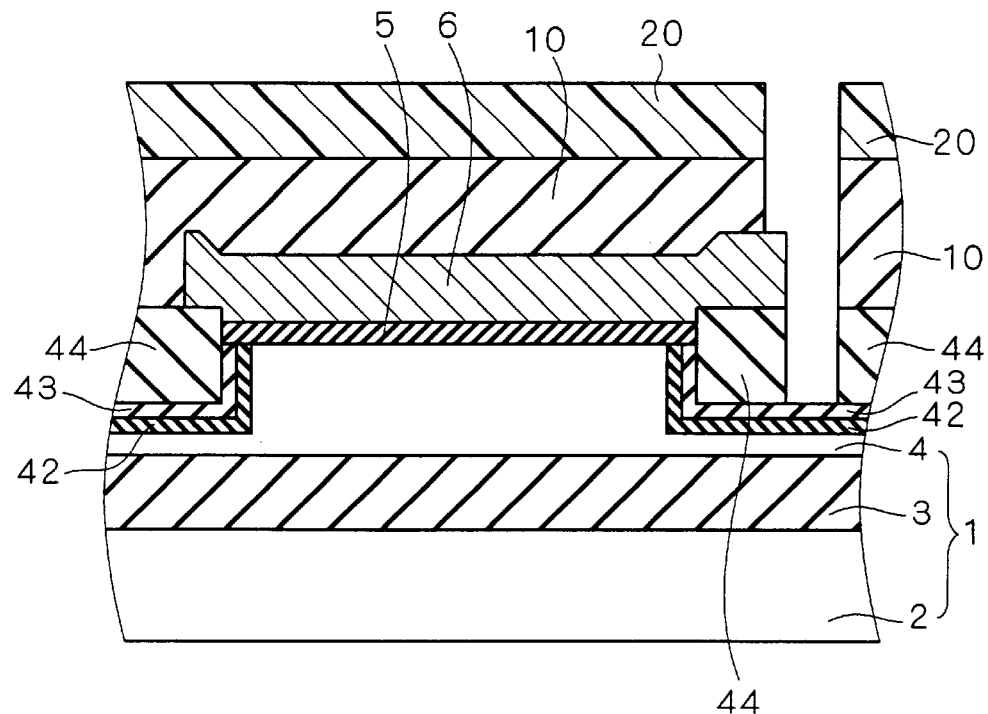

The polysilicon film 19 is then patterned to form the gate electrode 6, and ions are implanted to form the source/drain regions 8. For NMOS transistors, As ions are implanted at 10 to 50 keV at a dose of $1 \times 10^{15}$ to $5 \times 10^{15}$ cm$^{-2}$. For PMOS transistors, B or BF$_2$ ions are implanted at 10 to 50 keV at a dose of $1 \times 10^{15}$ to $5 \times 10^{15}$ cm$^{-2}$. After the interlayer insulation film 10 and the resist 20 are formed in the same way as in the first preferred embodiment, the interlayer insulation film 10 and the silicon oxide film 44 are dry-etched with the resist 20 as a mask, until the upper surface of the silicon nitride film 43 is exposed (FIG. 22). By etching the silicon oxide film and the silicon nitride film with high selectivity, the silicon nitride film 43 can serve as an etching stopper. Thus, it is easy to halt etching at the instant when the upper surface of the silicon nitride film 43 is exposed.

Figure 23:
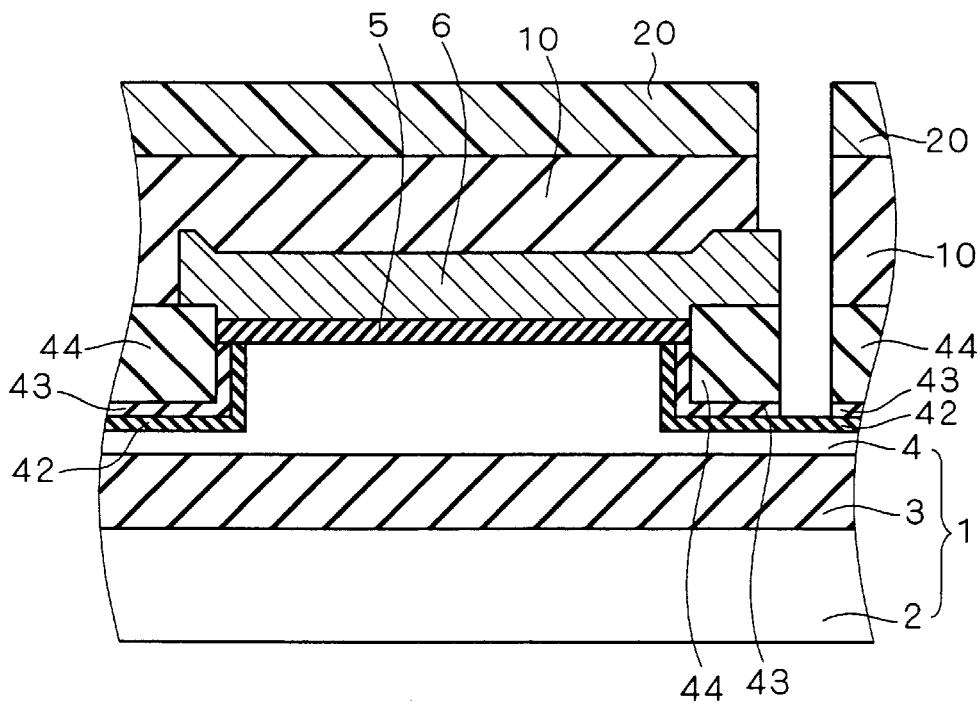
Figure 24:
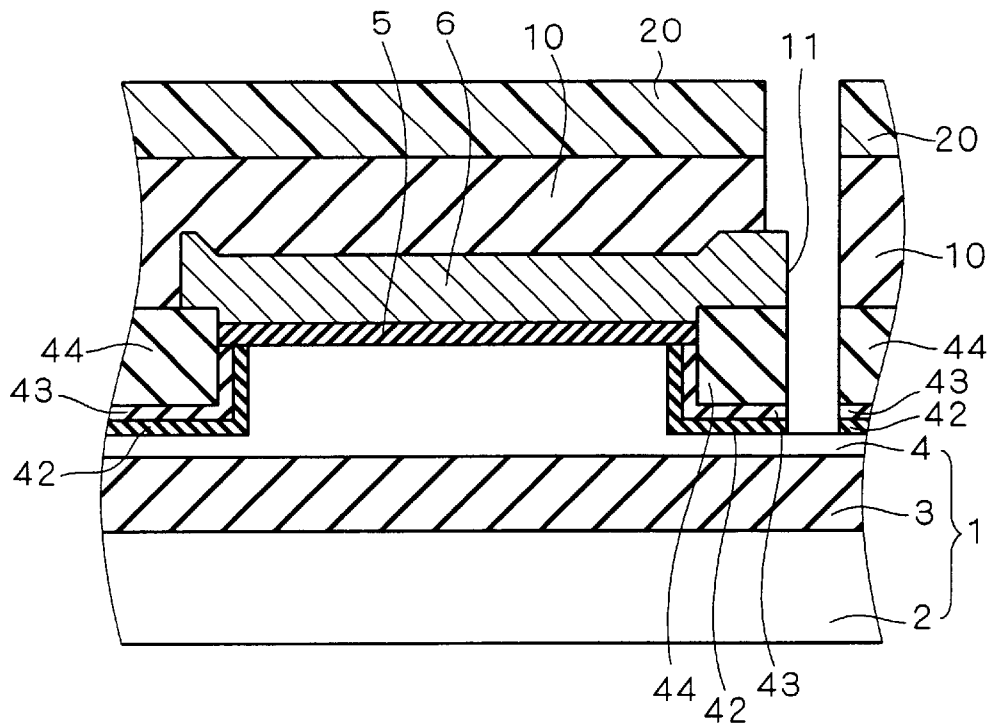

The silicon nitride film 43 exposed in the process of FIG. 22 is then removed by wet etching (FIG. 23). Also, the silicon oxide film 42 exposed in the process of FIG. 23 is removed by wet etching. These processes expose the upper surface of the SOI layer 4, completing the contact hole 11 (FIG. 24). Alternatively, after the process of FIG. 22, the silicon nitride film 43 and the silicon oxide film 42 may be removed at once by dry-etching the silicon oxide film and the silicon nitride film with low selectivity, using the resist 20 as a mask.

Figure 25:
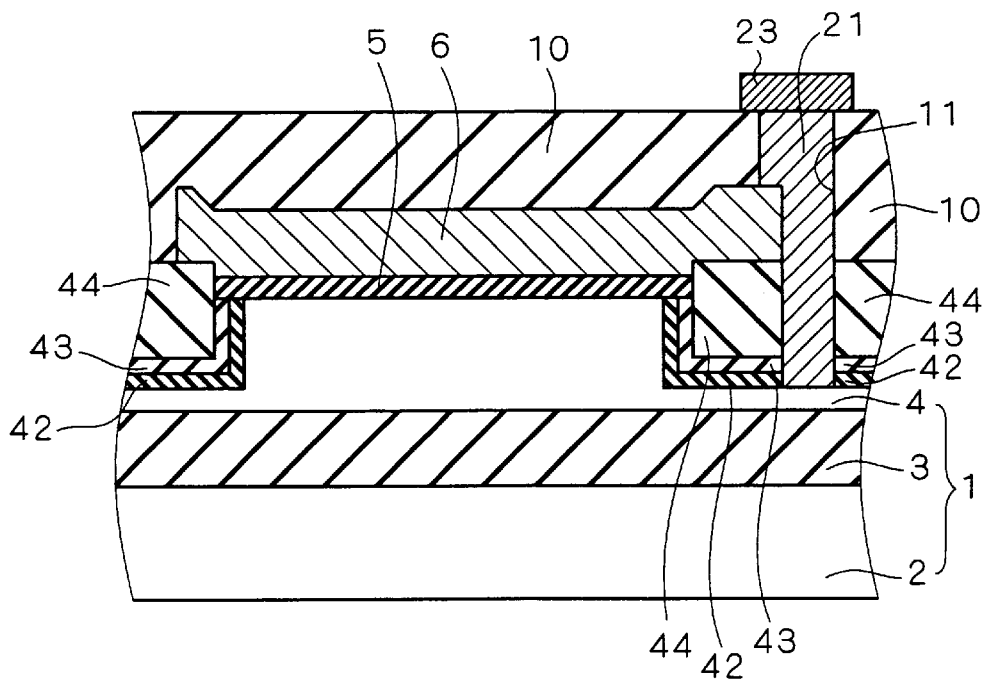

After removal of the resist 20, the contact hole 11 is filled with the W plug 21 and the Al interconnection layer 23 is formed on the part of the upper surface of the interlayer insulation film 10 where the contact hole 11 is formed (FIG. 25).

In the method of manufacturing a semiconductor device according to the third preferred embodiment, a silicon nitride film is previously provided between the element isolation insulation film and the body region to be used as an etching stopper in the etching of the element isolation insulation film to form a contact hole. Thus, even for a thin SOI layer between the bottom surface of the element isolation insulation film and the upper surface of the buried oxide film (several hundred angstroms in the above case), the contact hole does not reach the buried oxide film through the SOI layer. This ensures electric connections between the gate electrode and the body region.

Further, the anisotropic dry etching in the process of FIG. 17 produces a recessed portion, which is then filled by the formation of the element isolation insulation film. In terms of element miniaturization, this gives the device of the third preferred embodiment a considerable advantage over the method of the first preferred embodiment and the conventional semiconductor manufacturing method wherein the element isolation insulation film is formed by LOCOS. That is, the presence of bird's beak prevents a reduction in the effective area of the element forming region.

Furthermore, the adoption of partial trench isolation as the element isolation insulation film facilitates a pattern layout as compared to conventional complete isolation. That is, while complete isolation requires the optimization of the layout, partial trench isolation allows a direct use of the bulk layout for SOI.

Fourth Preferred Embodiment

As shown in FIG. 2, the DTMOS of the first preferred embodiment has the NMOS and PMOS transistors whose wells are in contact with each other. Under the application of voltage to effect the operation of the DTMOS, therefore, a forward bias may be applied across the wells, inducing leakage current and latch-up. The fourth preferred embodiment of the present invention proposes a DTMOS capable of preventing the occurrence of such leakage current and latch-up.

Figure 26:
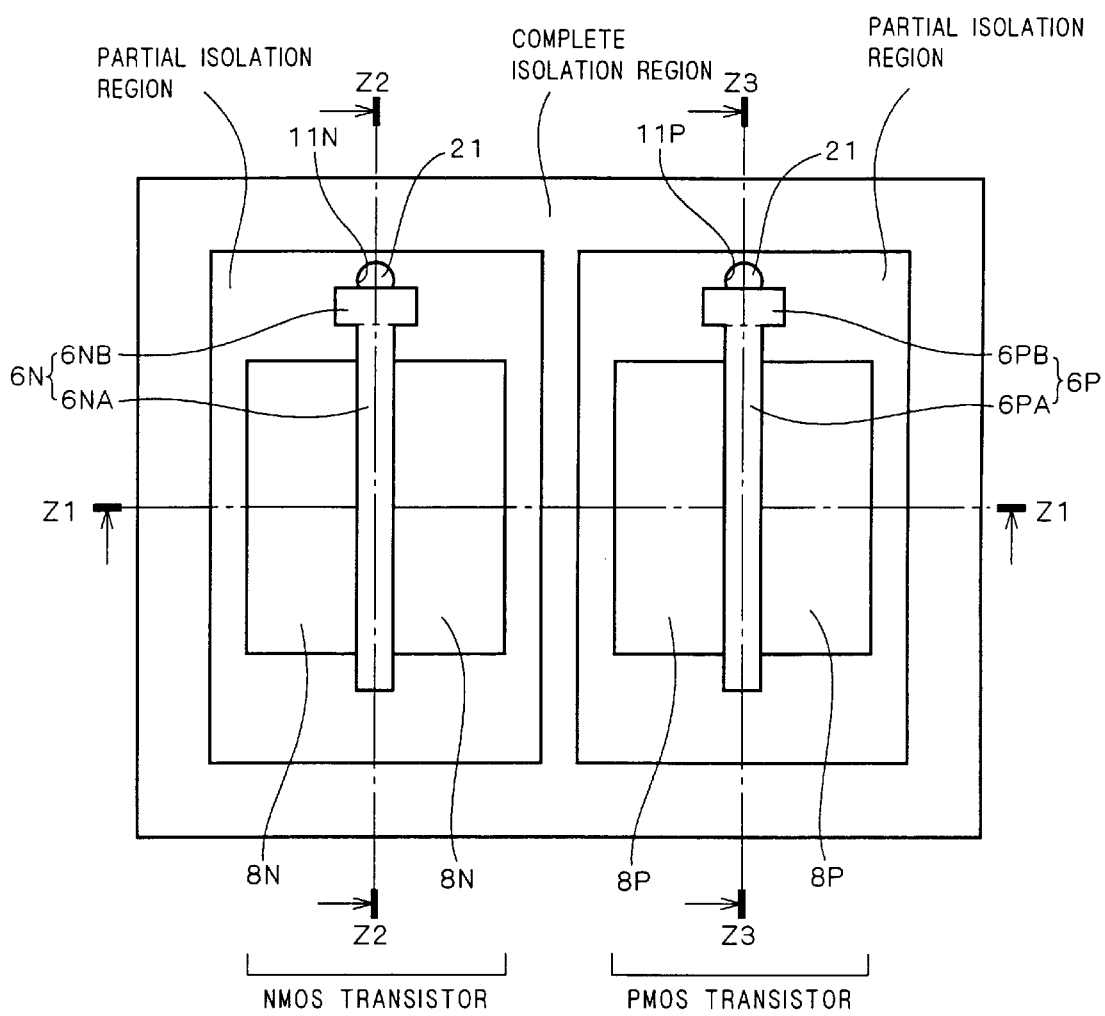
FIG. 26 is a top view showing the structure of a DTMOS according to a fourth preferred embodiment of the present invention.
Figure 27:
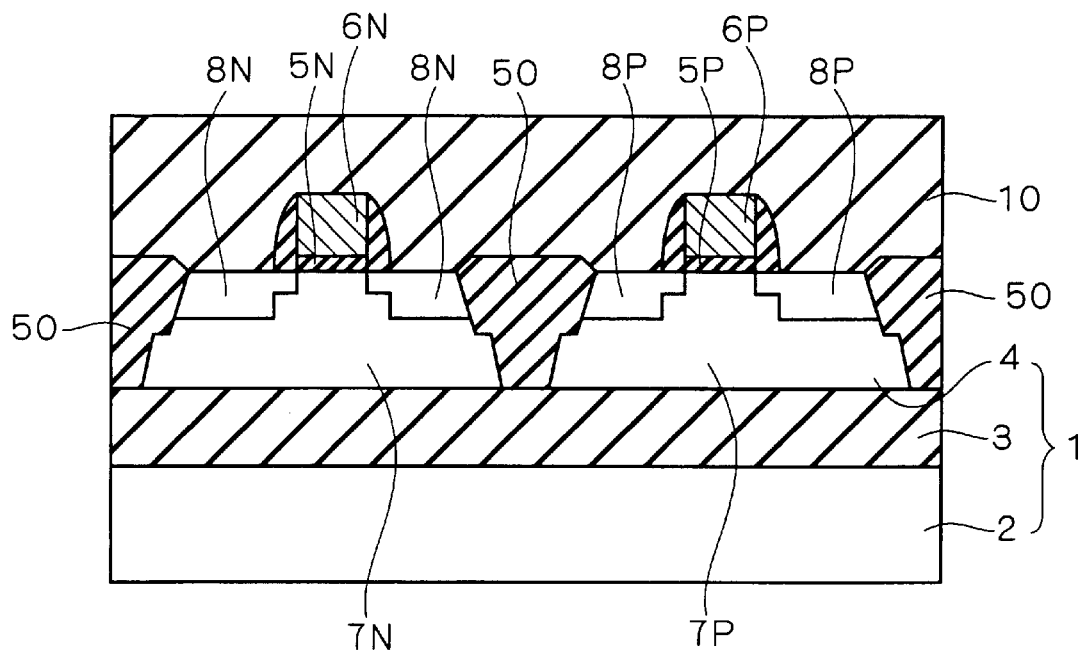
FIGS. 27 to 29 are cross-sectional views showing the structure of the DTMOS according to the fourth preferred embodiment.
Figure 28:
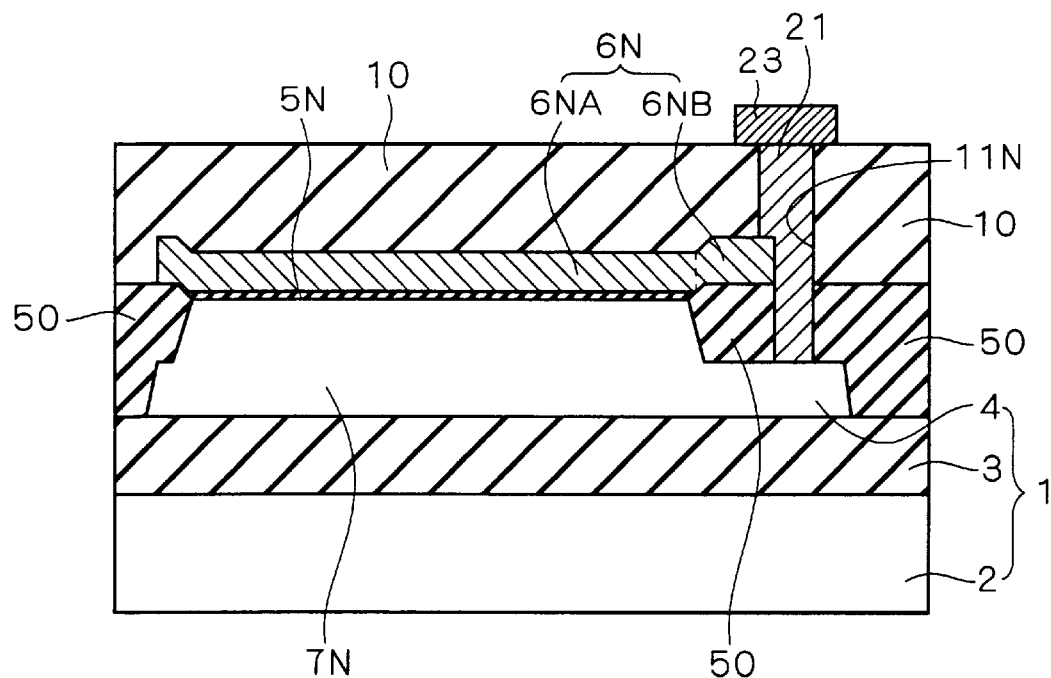
Figure 29:
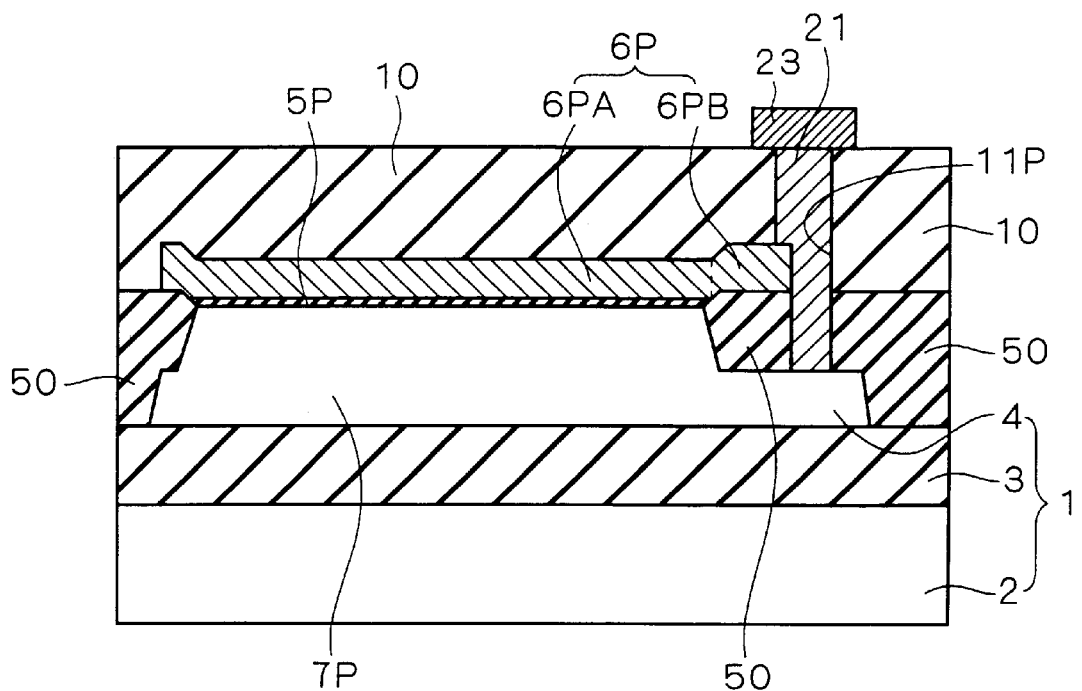

FIG. 26 is a top view showing the structure of a DTMOS according to the fourth preferred embodiment. Here the interlayer insulation film 10 and the Al interconnection layer 23 are not shown. FIGS. 27 to 29 are cross-sectional views of the DTMOS in FIG. 26 taken along the lines Z1, Z2, Z3, respectively. Referring to FIG. 26, partial isolation regions are provided to surround the source/drain regions 8N, 8P and a complete isolation region is provided to surround the partial isolation regions.

Referring to FIG. 27, the end portions of the bottom surface of an element isolation insulation film 50 do not reach the upper surface of the buried oxide film 3, which achieves partial isolation. The central portion of the bottom surface of the element isolation insulation film 50, on the other hand, reaches the upper surface of the buried oxide film 3, which achieves complete isolation. That is, the element isolation insulation film 50 has partial isolation portions achieving partial isolation and a complete isolation portion achieving complete isolation. In FIG. 26, the partial isolation portions of the element isolation insulation film 50 are formed in the partial isolation region, and the complete isolation portion thereof in the complete isolation region.

Referring to FIGS. 28 and 29, the contact hole 11N, 11P is formed in the upper surface of the interlayer insulation film 10, selectively passing through the interlayer insulation film 10 and the element isolation insulation film 50 to reach the bottom surface of the partial isolation portion of the element isolation insulation film 50. Otherwise, the structure of the semiconductor device of the fourth preferred embodiment is identical to that of the first preferred embodiment in FIGS. 1 to 4.

Figure 30:
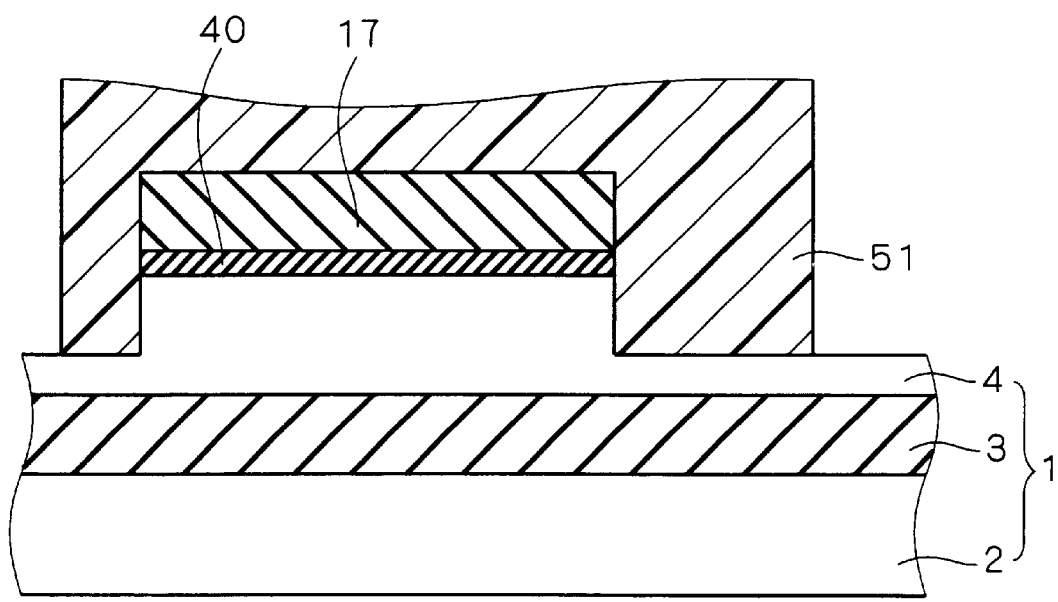
FIGS. 30 to 37 are cross-sectional views showing a method of manufacturing a DTMOS, step by step, according to the fourth preferred embodiment.

FIGS. 30 to 37 are cross-sectional views showing a method of manufacturing the DTMOS in FIGS. 26 to 29, step by step. First, the structure as in FIG. 17 is obtained through the same process as in the third preferred embodiment. Then, a resist 51 is formed in a region other than where the complete isolation portion of the element isolation insulation film 50 is to be formed (FIG. 30).

Figure 31:
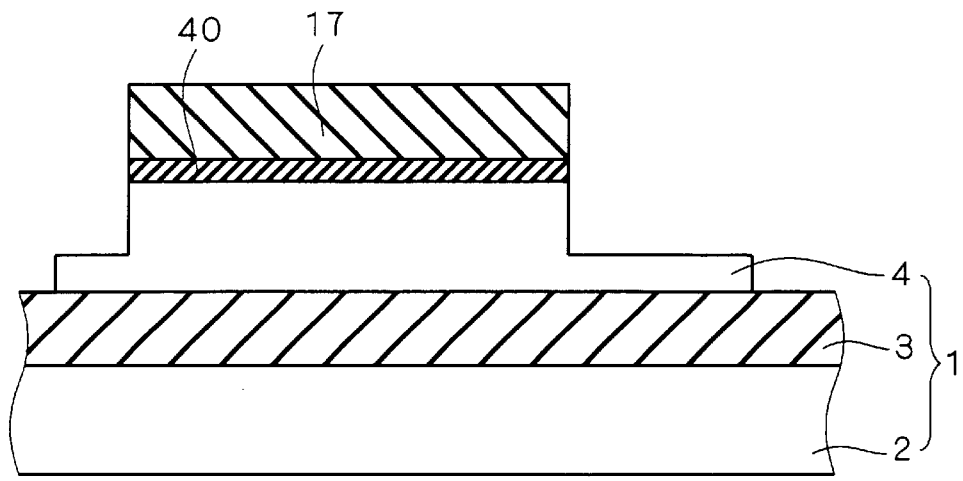

With the resist 51 as a mask, the SOI layer 4 is etched by anisotropic dry etching having a high etch rate in the depth direction of the SOI substrate 1, until the upper surface of the buried oxide film 3 is exposed. Then, the resist 51 is removed (FIG. 31).

Figure 32:
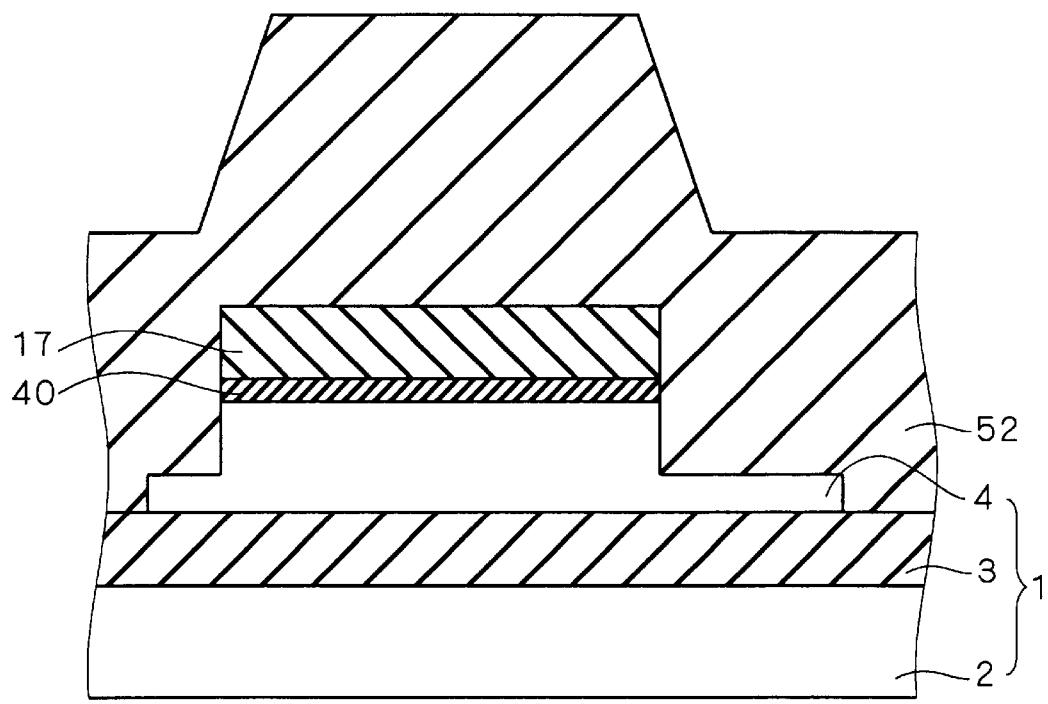
Figure 33:
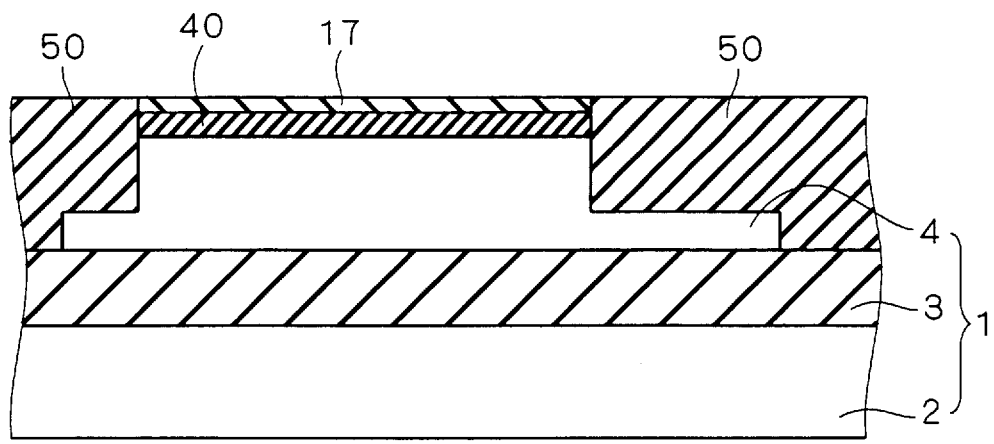

A silicon oxide film 52 with a thickness of about 5,000 Å is formed over the entire surface by CVD (FIG. 32). Leaving part of the bottom of the silicon nitride film 17, the silicon oxide film 52 and the silicon nitride film 17 are polished by CMP to planarize the surface. This process produces the element isolation insulation film 50 with the partial isolation portions and the complete isolation portion (FIG. 33).

Figure 34:
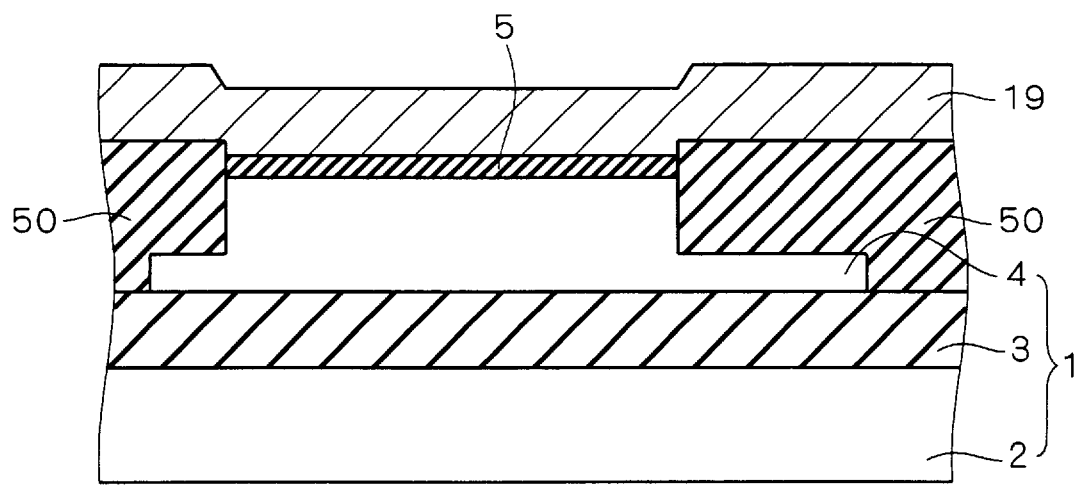

After removal of the remaining silicon nitride film 17, ions are implanted to form a channel region. For NMOS transistors, B ions are implanted at 20 to 50 keV at a dose of $1 \times 10^{12}$ to $1 \times 10^{13}$ cm$^{-2}$. For PMOS transistors, As ions are implanted at 100 to 160 keV at a dose of $1 \times 10^{12}$ to $1 \times 10^{13}$ cm$^{-2}$. The silicon oxide film 40 is then removed and the gate oxide film 5 is formed by thermal oxidation. After that, the polysilicon film 19 is formed over the entire surface by CVD (FIG. 34).

Figure 35:
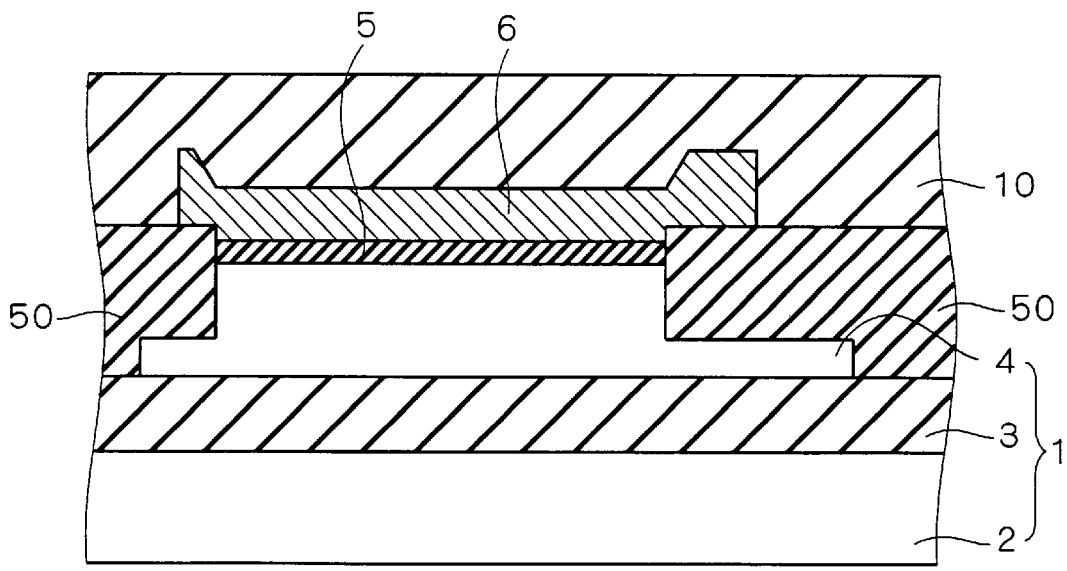

The polysilicon film 19 is then patterned to form the gate electrode 6, and ions are implanted to form the source/drain regions 8. For NMOS transistors, As ions are implanted at 10 to 50 keV at a dose of $1 \times 10^{15}$ to $5 \times 10^{15}$ cm$^{-2}$. For PMOS transistors, B or BF$_2$ ions are implanted at 10 to 50 keV at a dose of $1 \times 10^{15}$ to $5 \times 10^{15}$ cm$^{-2}$. The interlayer insulation film 10 is then formed over the entire surface by CVD (FIG. 35).

Figure 36:
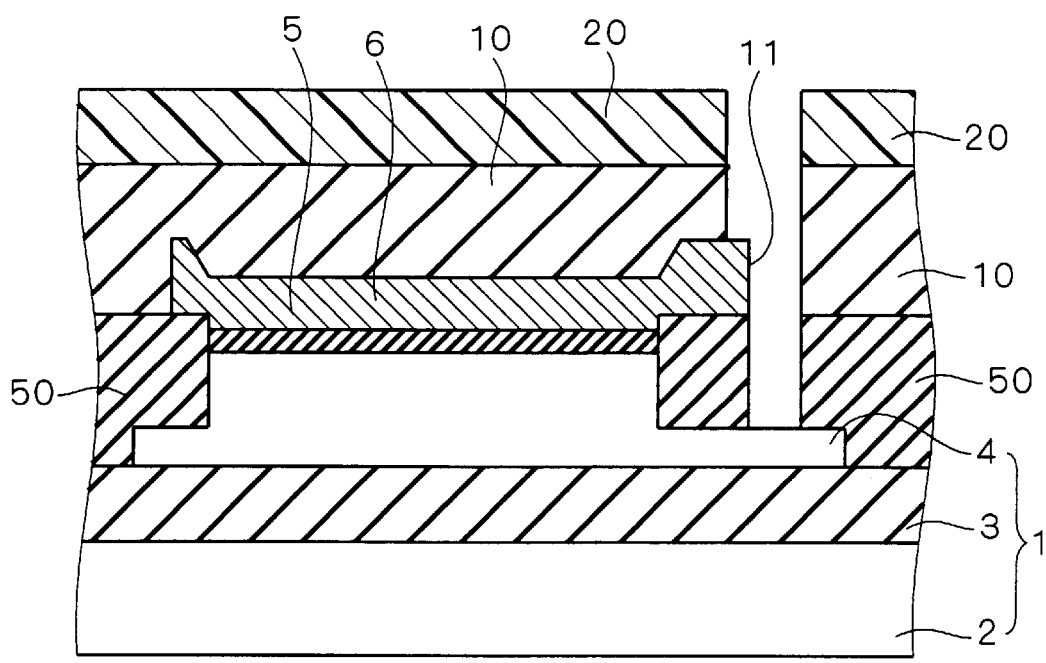

After the resist 20 is formed on the interlayer insulation film 10, the interlayer insulation film 10 and the element isolation insulation film 50 are dry-etched with the resist 20 as a mask, until the upper surface of the SOI layer 4 is exposed (FIG. 36). The resist 20 is then removed and the contact hole 11 is filled with the W plug 21. Following this, the Al interconnection layer 23 is formed on the part of the upper surface of the interlayer insulation film 10 where the contact hole 11 is formed. This results in the structure shown in FIG. 28.

Figure 37:
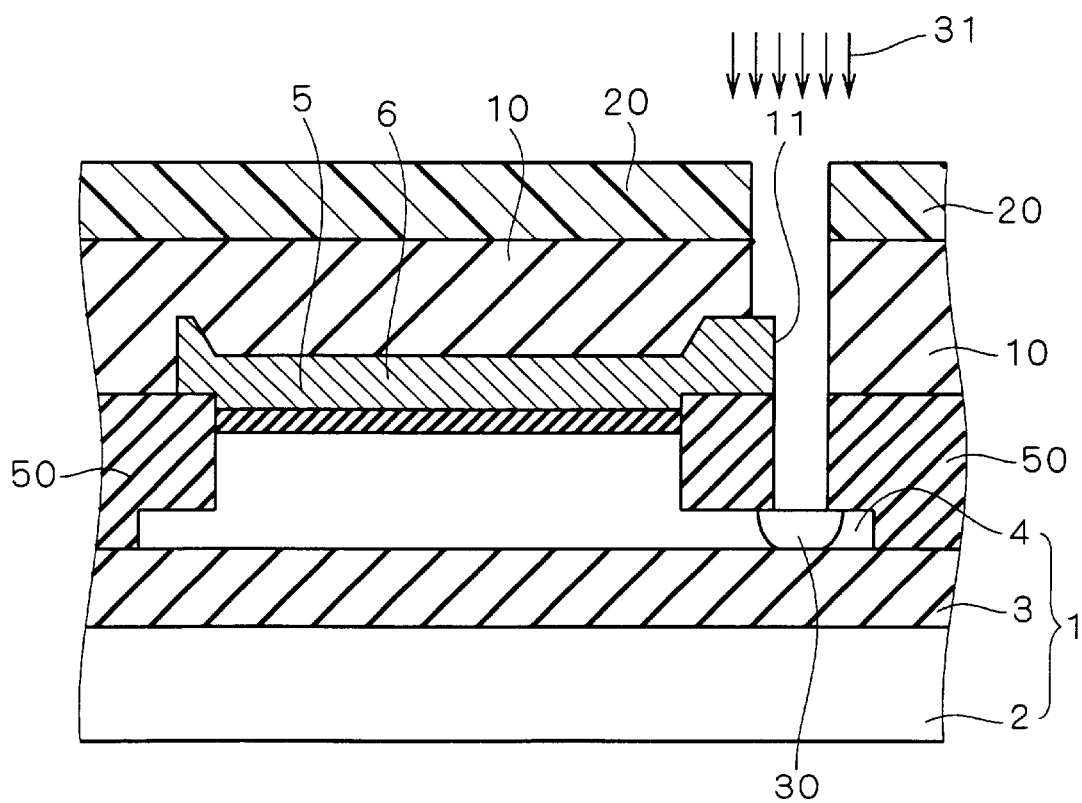

After obtaining the structure in FIG. 36, a $p^+$-type high-concentration impurity region 30 may be formed, as in the second preferred embodiment, by introducing impurities 31 such as As (n-type impurities such as B, $BF_2$ for the formation of an $n^+$-type high-concentration impurity region 30) into the upper surface of the SOI layer 4 which is exposed by the opening of the contact hole 11, using the resist 20 as a mask (FIG. 37).

Further, as in the third preferred embodiment, a silicon nitride film may be provided previously between the element isolation insulation film 50 and the SOI layer 4 to be used as an etching stopper in the etching of the element isolation insulation film 50 to form the contact hole 11.

In the semiconductor device and manufacturing method of the same according to the fourth preferred embodiment, the complete isolation portion of the element isolation insulation film provides complete electrical isolation between the NMOS and PMOS transistors. This appropriately prevents the occurrence of leakage current and latch-up in the operation of the DTMOS.

Figure 38:
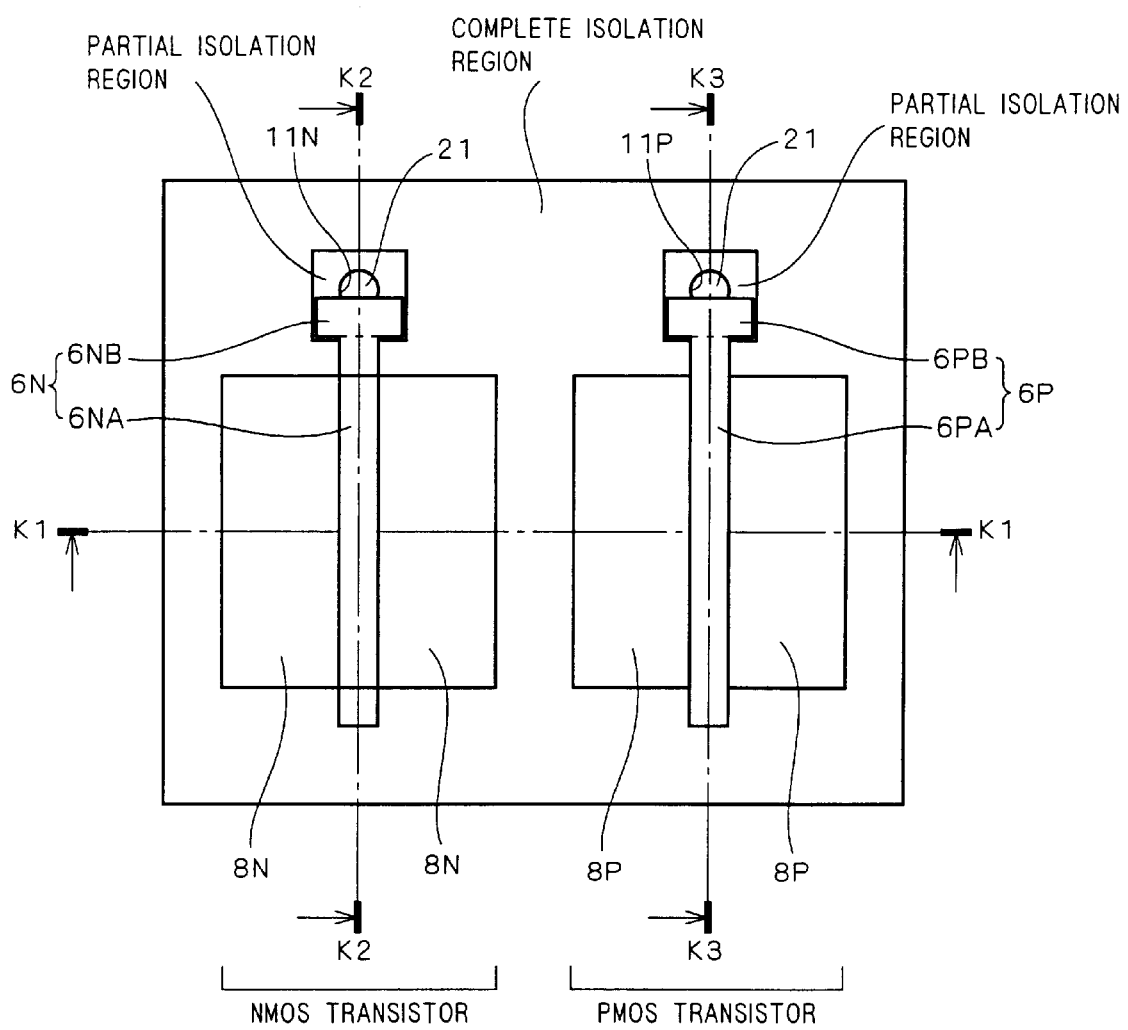
FIG. 38 is a top view showing the structure of a DTMOS according to a variant of the fourth preferred embodiment
Figure 39:
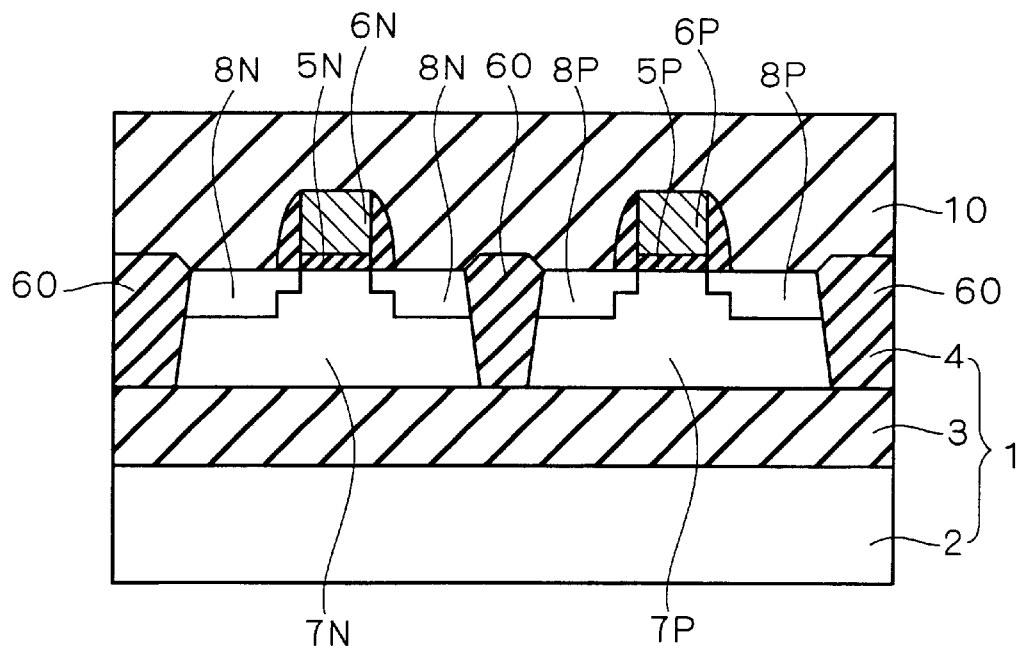
FIGS. 39 to 41 are cross-sectional views showing the structure of the DTMOS according to the variant of the fourth preferred embodiment.
Figure 40:
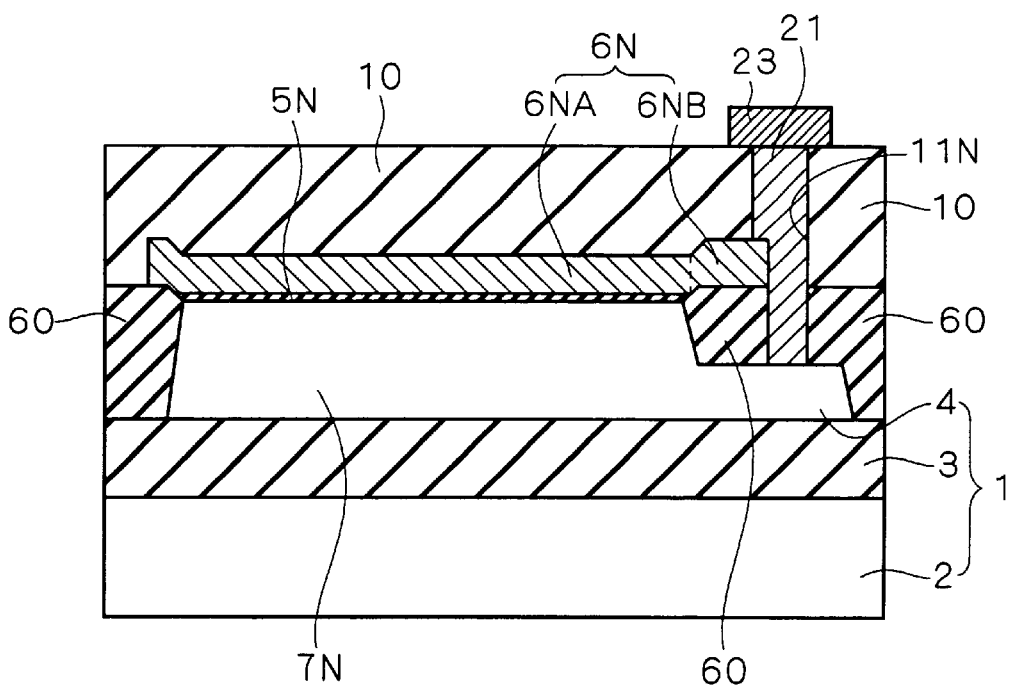
Figure 41:
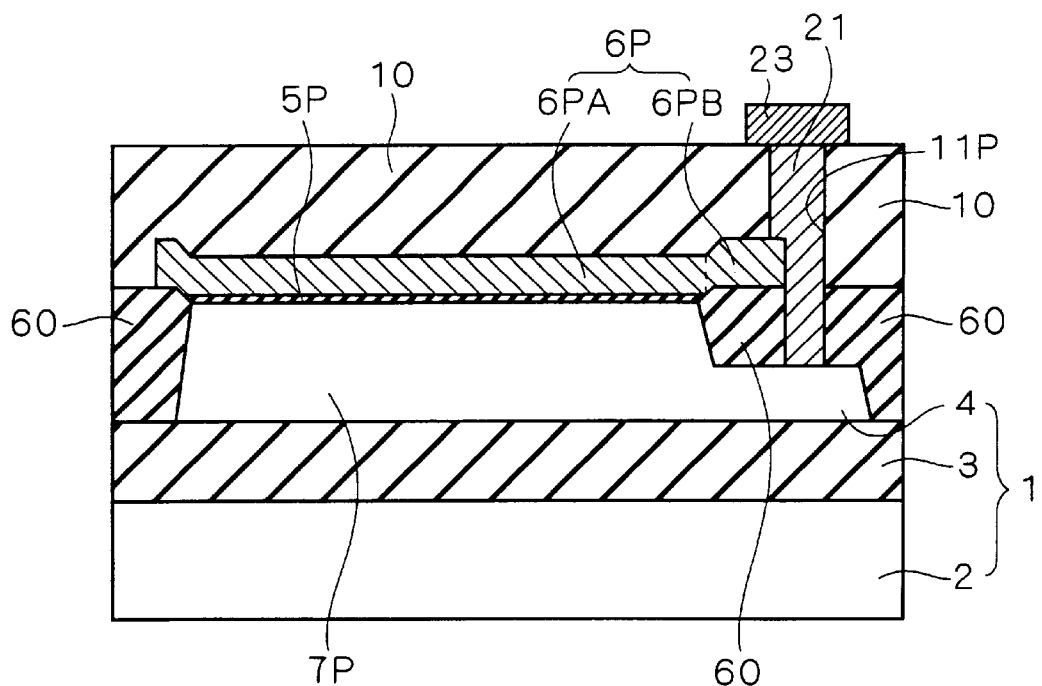
Figure 42:
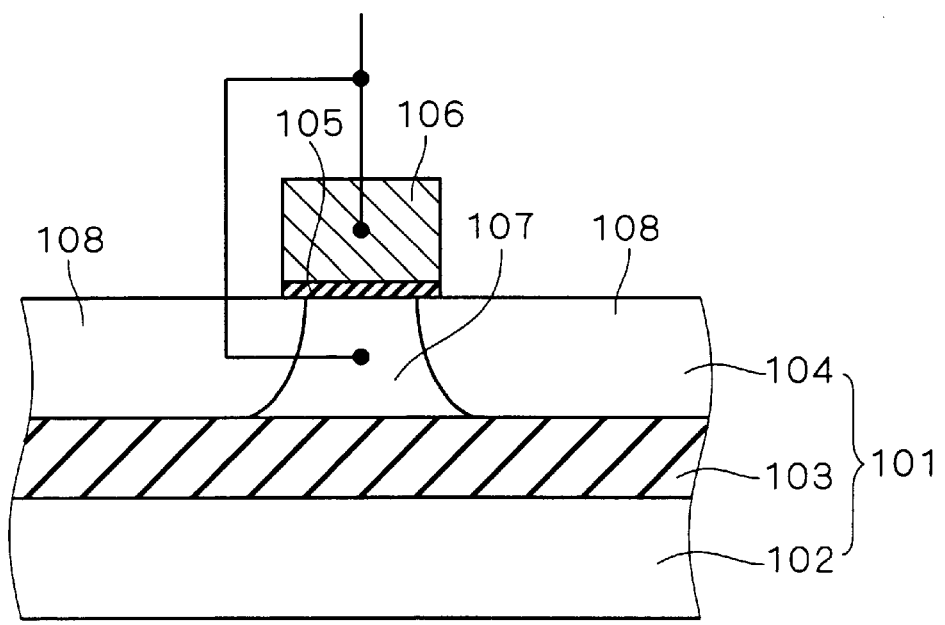
FIG. 42 is a cross-sectional view schematically showing the structure of a conventional DTMOS.
Figure 43:
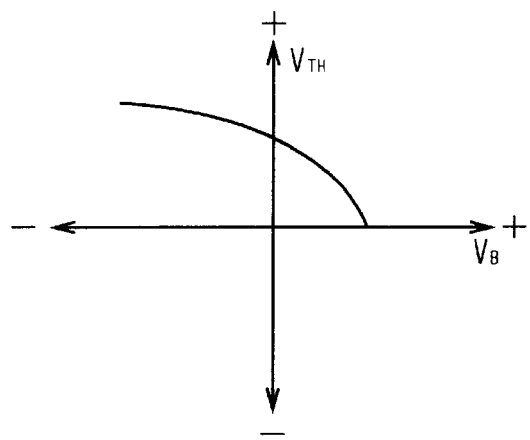
FIG. 43 is a graph showing the relationships between body potential and operating threshold voltage of DTMOS.
Figure 44:
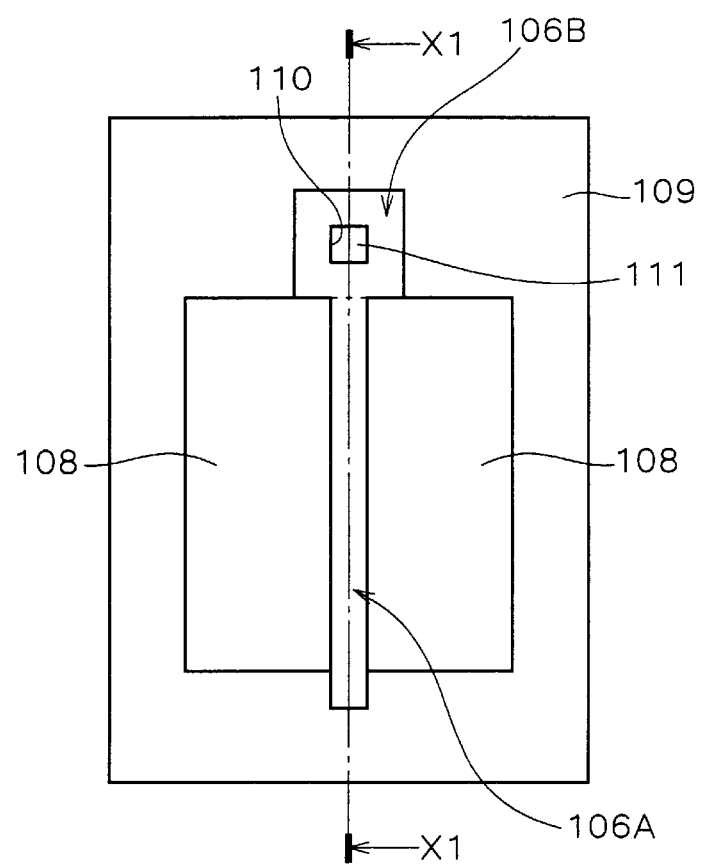
FIG. 44 is a top view showing the structure of the conventional DTMOS.
Figure 45:
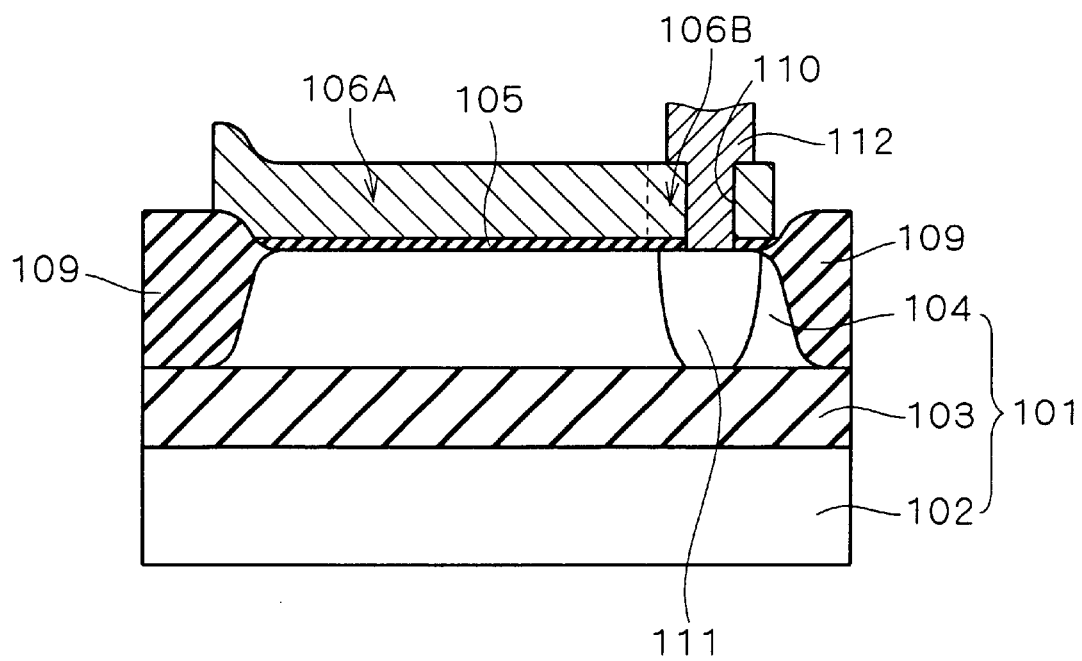
FIG. 45 is a cross-sectional view showing the structure of the conventional DTMOS.

FIG. 38 is a top view showing another structure of the DTMOS according to a variant of the fourth preferred embodiment. Here the interlayer insulation film 10 and the Al interconnection layer 23 are not shown. FIGS. 39 to 41 are cross-sectional views of the DTMOS in FIG. 38 taken along the lines K1, K2, K3, respectively. Referring to FIG. 38, a complete isolation region is provided to surround the source/drain regions 8N, 8P and partial isolation regions are provided only around the contact holes 11N and 11P.

Referring to FIG. 39, like the element isolation insulation film 50, an element isolation insulation film 60 has partial isolation portions and a complete isolation portion which is located between the NMOS and PMOS transistors. Referring to FIGS. 40 and 41, the contact holes 11N and 11P are formed in the upper surface of the interlayer insulation film 10, selectively passing through the interlayer insulation film 10 and the element isolation insulation film 60 to reach the bottom surfaces of the respective partial isolation portions of the element isolation insulation film 60.

The DTMOS in FIGS. 38 to 41 can be manufactured through the same process as in FIGS. 30 to 37 by modifying the opening pattern of the resist 51 in the process of FIG. 30.

In the semiconductor device according to the variant of the fourth preferred embodiment, unlike the structure of FIG. 26, only the complete isolation portion of the element isolation insulation film is between the NMOS and PMOS transistors. This achieves a reduction in device dimension as well as the aforementioned effects.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
    (a) preparing an SOI substrate having a multilayer structure with a semiconductor substrate, an insulating layer, and a semiconductor layer stacked in this order;
    (b) forming a first element isolation insulation film in an upper surface of said semiconductor layer to a predetermined depth that does not reach an upper surface of said insulating layer, in an element isolation region of said SOI substrate;
    (c) forming a gate insulation film on said upper surface of said semiconductor layer in an element forming region of said SOI substrate;
    (d) forming a gate electrode on said gate insulation film and said first element isolation insulation film;
    (e) forming an interlayer insulation film on said gate electrode and said first element isolation insulation film;
    (f) selectively forming a contact hole in an upper surface of said interlayer insulation film, extending through said first element isolation insulation film to said upper surface of said semiconductor layer, in said element isolation region of said SOI substrate, said contact hole being in contact with said gate electrode on said first element isolation insulation film; and
    (g) filling said contact hole with a conductor.

2. The method according to claim 1, further comprising the step of:
    (h) between said steps (f) and (g), forming an impurity region with a higher impurity concentration than said semiconductor layer, by introducing impurities into said upper surface of said semiconductor layer through said contact hole.

3. The method according to claim 1, further comprising the step of:
    (i) before said step (f), forming an insulation film between a bottom surface of said first element isolation insulation film and said upper surface of said semiconductor layer, said insulation film being made with a material different from said first element isolation insulation film,
    wherein said step (f) includes the steps of:
        (f-1) selectively removing said interlayer insulation film and said first element isolation insulation film, using said insulation film as an etching stopper; and
        (f-2) removing said insulation film exposed in said step (f-1).

4. The method according to claim 3, wherein
said first element isolation insulation film and said interlayer insulation film are silicon oxide films; and
said insulation film is a silicon nitride film.

5. The method according to claim 1, wherein
said step (b) includes the steps of:
    (b-1) forming a recessed portion by removing said upper surface of said semiconductor layer in said element isolation region by anisotropic etching having a high etch rate in a depth direction of said SOI substrate; and
    (b-2) forming said first element isolation insulation film to fill said recessed portion.

6. The method according to claim 1, wherein
said semiconductor device includes a plurality of semiconductor devices,
said method further comprising the step of:
    (j) forming a second element isolation insulation film extending from said upper surface of said semiconductor layer to said upper surface of said insulating layer, between adjacent ones of said semiconductor devices, wherein said step (b) and (j) are performed by the steps of:

(x-1) forming a first recessed portion by removing said upper surface of said semiconductor layer in said element isolation region to a depth that does not reach said upper surface of said insulating layer;

(x-2) forming a second recessed portion reaching said upper surface of said insulating layer, by selectively removing a bottom surface of said first recessed portion; and (x-3) filling said first and second recessed portions with insulation films.

* * * * *